United States Patent
Maejima

(10) Patent No.: US 10,672,483 B2
(45) Date of Patent: Jun. 2, 2020

(54) SEMICONDUCTOR MEMORY DEVICE

(71) Applicant: TOSHIBA MEMORY CORPORATION, Tokyo (JP)

(72) Inventor: Hiroshi Maejima, Setagaya Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 97 days.

(21) Appl. No.: 16/112,378

(22) Filed: Aug. 24, 2018

(65) Prior Publication Data

US 2019/0295657 A1 Sep. 26, 2019

(30) Foreign Application Priority Data

Mar. 22, 2018 (JP) ................. 2018-054238

(51) Int. Cl.
*G11C 16/24* (2006.01)
*G11C 16/26* (2006.01)
*G11C 16/04* (2006.01)
*G06F 3/06* (2006.01)
*G11C 11/56* (2006.01)

(52) U.S. Cl.
CPC ............ *G11C 16/26* (2013.01); *G06F 3/0604* (2013.01); *G06F 3/0655* (2013.01); *G06F 3/0679* (2013.01); *G11C 16/0483* (2013.01); *G11C 16/24* (2013.01); *G11C 11/5642* (2013.01); *G11C 11/5671* (2013.01)

(58) Field of Classification Search
CPC ..................................................... G11C 16/24
USPC ..................................................... 365/185.11
See application file for complete search history.

(56) References Cited

U.S. PATENT DOCUMENTS

| 2013/0148407 A1* | 6/2013 | Tsuji ............ G11C 13/0004 365/148 |
| 2013/0336071 A1* | 12/2013 | Kwon .............. G11C 16/10 365/185.22 |
| 2014/0122773 A1* | 5/2014 | Abraham ......... G11C 16/0483 711/103 |

(Continued)

OTHER PUBLICATIONS

"A 512Gb 3b/Cell Flash Memory on 64-Word-Line-Layer BiCS Technology", R. Yamashita et. al, IEEE International Solid-State Circuits Conference, Digest of Technical Papers, pp. 196-197. (ISSCC 2017/Session 11/Nonvolatile Memory Solutions/11.1) (Year: 2017).*

(Continued)

*Primary Examiner* — Min Huang
(74) *Attorney, Agent, or Firm* — Kim & Stewart LLP

(57) ABSTRACT

A memory device includes a memory cell array with memory strings including a first and second select transistor and memory cells between the first and second select transistors. Each memory string has a bit line connected thereto. A different word line is connected to each of the memory cells of a memory strings. A control circuit is configured to execute a first read operation in which data is read at the same time from memory cells connected to all the bit lines and a second read operation in which data is read from memory cells connected to a first subset of bit lines and a shield voltage is applied to a second subset of bit lines in the plurality of bit lines. The controller selects the first or second read operation for execution according to the number of read voltage levels required for determining data in the memory cells.

19 Claims, 17 Drawing Sheets

(56) References Cited

U.S. PATENT DOCUMENTS

2015/0071005 A1* 3/2015 Maejima ................ G11C 16/28
365/185.21
2018/0364931 A1* 12/2018 Siau ................... G11C 13/0038

OTHER PUBLICATIONS

"A 512Gb 3b/Cell Flash Memory on 64-Word-Line-Layer BiCS Technology", R. Yamashita et. al, IEEE International Solid-State Circuits Conference, Digest of Technical Papers, pp. 196-197. (ISSCC 2017/Session 11/Nonvolatile Memory Solutions/11.1).

\* cited by examiner

ABL

ABL

SBL

SBL

LP read

MP read

UP read

SEMICONDUCTOR MEMORY DEVICE

CROSS-REFERENCE TO RELATED APPLICATIONS

This application is based upon and claims the benefit of priority from Japanese Patent Application No. 2018-054238, filed Mar. 22, 2018, the entire contents of which are incorporated herein by reference.

FIELD

Embodiments described herein relate generally to a semiconductor memory device.

BACKGROUND

NAND flash memories are well-known. In addition, NAND flash memories including memory cells that are three-dimensionally stacked are known.

DETAILED DESCRIPTION

Figure 1:
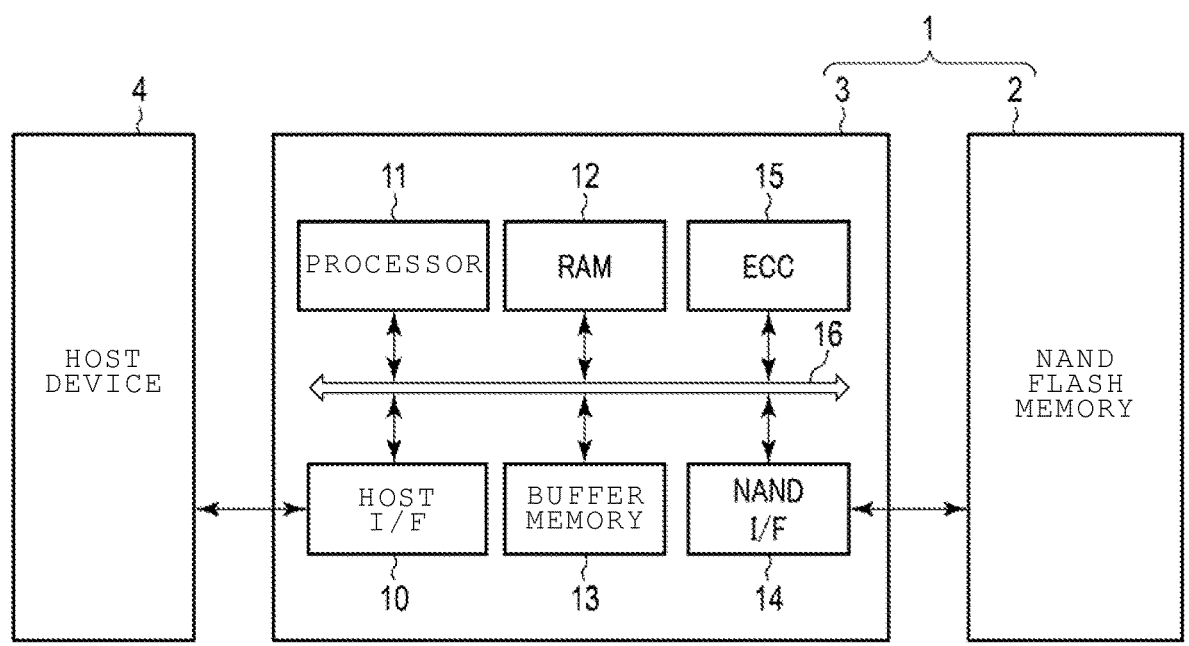
FIG. 1 is a block diagram of a memory system according to a first embodiment.

Embodiments provide semiconductor memory devices capable of shortening a read time.

In general, according to one embodiment, a semiconductor memory device comprises a memory cell array including memory strings. Each memory string includes a first select transistor and a second select transistor. A plurality of memory cells is connected in series between the first and second select transistors of the memory strings. A plurality of bit lines is provided. Each memory string has a respective bit line connected thereto. A plurality of word lines is provided. Each word line is connected to a different one of the memory cells in the memory strings. A control circuit, such as a sequencer or the like, is configured to execute a first read operation in which data is read at the same time from memory cells connected to all the bit lines in the plurality of bit lines and a second read operation in which data is read from memory cells connected to a first subset of bit lines in the plurality of bit lines and a shield voltage is applied to a second subset of bit lines in the plurality of bit lines. The controller is further configured to select the first read operation or the second read operation according to the number of read voltage levels required for determining data stored in the memory cells.

Hereinafter, example embodiments will be described with reference to the drawings. These example embodiments are provided to illustrate devices and methods incorporating technical concepts of the present disclosure, and the present disclosure is not limited to particular shapes, structures, the arrangements, and the like of constituent components in the example embodiments. Furthermore, each functional block or unit can be realized by hardware, software, or a combination of both hardware and software. Additionally, it is not essential that each described functional block be separately implemented as in the following examples. For example, some functions may be executed by functional blocks combining the functional blocks illustrated in the examples or in hardware providing several different functions according to the execution of software and/or firmware. In addition, each functional block illustrated as an example may be further divided into sub blocks. In the following description, the same reference numeral will be assigned to elements having substantially the same function and configuration, and duplicate description of repeated elements may be omitted.

1 First Embodiment

1-1 Configuration of Memory System 1

FIG. 1 is a block diagram of a memory system 1 according to a first embodiment. The memory system 1 includes a NAND flash memory 2 and a memory controller 3.

The memory system 1 may be configured by mounting the chips constituting the memory system. 1 on a main board in which a host device is mounted, or the memory system 1 may be configured as a system large-scale integrated circuit (LSI) or a system-on-chip (SoC) that is implemented as one module. Examples of the memory system 1 include a memory card such as an SD™ card, a solid state drive (SSD), an embedded multimedia card (eMMC), and the like.

The NAND flash memory 2 includes memory cell transistors and stores data in a nonvolatile manner. A specific configuration of the NAND flash memory 2 will be described later.

The memory controller 3 directs the NAND flash memory 2 to write (also referred to as program), read, erase, or the like in response to a command from a host device 4. In addition, the memory controller 3 manages the memory space of the NAND flash memory 2. The memory controller 3 includes a host interface circuit (host I/F) 10, a processor 11, a random access memory (RAM) 12, a buffer memory 13, a NAND interface circuit (NAND I/F) 14, an error checking and correcting (ECC) circuit 15, and the like interconnected via a bus 16.

The host interface circuit 10 is connected to the host device 4 via a host bus and performs an interface process for the host device 4. In addition, the host interface circuit 10 transmits/receives a command, an address, and data to/from the host device 4.

The processor 11, for example, is formed of a central processing unit (CPU). The processor 11 controls the overall operation of the memory controller 3. For example, when a write command is received from the host device 4, the processor 11 issues a write command based on the NAND interface protocol to the NAND flash memory 2 in response thereto. An operation performed for read or erase is similar thereto. In addition, the processor 11 executes various processes for managing the NAND flash memory 2 such as wear leveling and garbage collection.

The RAM 12 is used as a work area of the processor 11 and stores firmware loaded from the NAND flash memory 2, various tables generated by the processor 11, and the like. The RAM 12 is a DRAM and/or an SRAM. The buffer memory 13 temporarily stores data transmitted from the host device 4 and temporarily stores data transmitted from the NAND flash memory 2. The buffer memory 13 may be provided in the RAM 12.

When a write operation is performed, the ECC circuit 15 generates an error correcting code for write data, adds the error correcting code to the write data, and transmits resultant data to the NAND interface circuit 14. In addition, when a read operation is performed, the ECC circuit 15 performs error detection and/or error correction using the error correcting code included in read data for the read data. In addition, the ECC circuit 15 may be disposed in the NAND interface circuit 14.

The NAND interface circuit 14 is connected to the NAND flash memory 2 via a NAND bus and performs an interface process for the NAND flash memory 2. In addition, the NAND interface circuit 14 transmits/receives a command, an address, and data to/from the NAND flash memory 2.

1-1-1 Configuration of NAND Flash Memory 2

Figure 2:
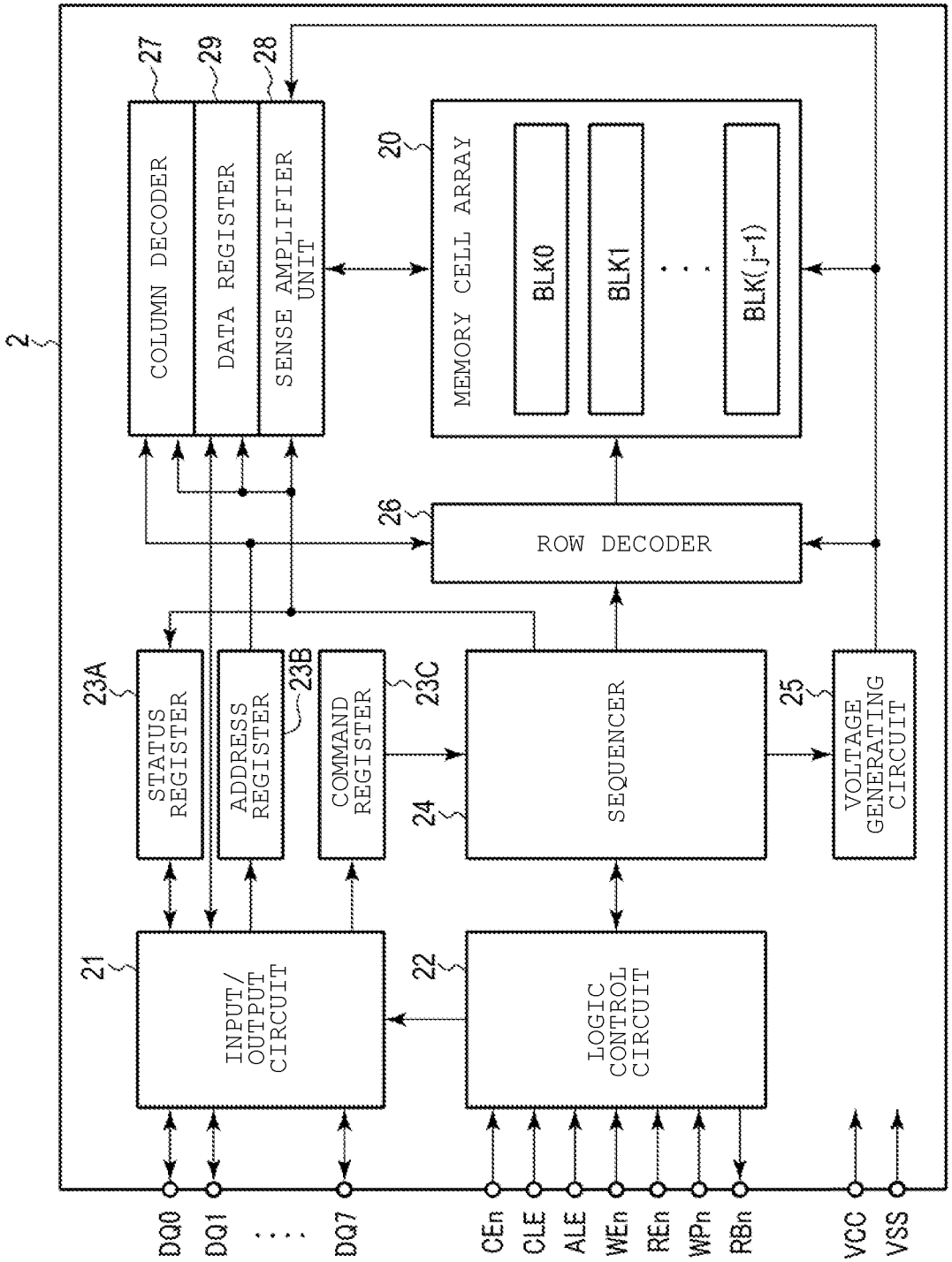
FIG. 2 is a block diagram of a NAND flash memory illustrated in FIG. 1.

FIG. 2 is a block diagram of the NAND flash memory 2 illustrated in FIG. 1.

The NAND flash memory 2 includes a memory cell array 20, an input/output circuit 21, a logic control circuit 22, a register group, which includes a status register 23A, an address register 23B, and a command register 23C, a sequencer 24, also referred to as a control circuit in some instances, a voltage generating circuit 25, a row decoder 26, a column decoder 27, a sense amplifier unit 28, and a data register 29, which is also referred to as a data cache in some instances.

The memory cell array 20 includes j blocks BLK0 to BLK(j-1). Here, "j" is an integer of one or more. Each of blocks BLK includes several memory cell transistors. A memory cell transistor provides a memory cell that is electrically rewritable. In the memory cell array 20, in order to control a voltage applied to each memory cell transistor, bit lines, word lines, a source line, and the like are disposed. A specific configuration of the block BLK will be described later.

The input/output circuit 21 and the logic control circuit 22 are connected to the memory controller 3 via the NAND bus. The input/output circuit 21 transmits/receives a signal DQ (for example, DQ0 to DQ7) to/from the memory controller 3 via the NAND bus.

The logic control circuit 22 receives external control signals (for example, a chip enable signal CEn, a command latch enable signal CLE, an address latch enable signal ALE, a write enable signal WEn, a read enable signal REn, and a write protection signal WPn) from the memory controller 3 via the NAND bus. Here, when "n" is added to the signal name this represents a signal which is an active low signal. In addition, the logic control circuit 22 transmits a ready/busy signal RBn to the memory controller 3 via the NAND bus.

The signal CEn enables select of the NAND flash memory 2 and is asserted when the NAND flash memory 2 is selected. The signal CLE enables a command transmitted as a signal DQ to be latched in the command register. The signal ALE enables an address transmitted as a signal DQ to be latched in the address register. The signal WEn enables data to be input to the NAND flash memory 2 via the signal line DQ. The signal REn enables data to be output from the NAND flash memory 2 via the signal line DQ. The signal WPn is asserted when write and erase are prohibited. The signal RBn indicates whether the NAND flash memory 2 is in a ready state (a state in which a command can be accepted from the outside) or a busy state (a state in which a command cannot be accepted from the outside). The memory controller 3 receives the signal RBn from the NAND flash memory 2 and thus can acquire the state of the NAND flash memory 2.

The status register 23A temporarily stores data that is necessary for the operation of the NAND flash memory 2. The address register 23B temporarily stores an address. The command register 23C temporarily stores a command. The status register 23A, the address register 23B, and the command register 23C, for example, are configured using SRAM.

The control circuit 24 receives a command from the command register 23C and controls the overall operation of the NAND flash memory 2 in a sequence according to the command.

The voltage generating circuit 25 receives a power source voltage from the outside of the NAND flash memory 2 and generates the voltages that are necessary for a write operation, a read operation, and an erase operation using the power source voltage. The voltage generating circuit 25 supplies the generated voltages to the memory cell array 20, the row decoder 26, and the sense amplifier unit 28, the like.

The row decoder 26 receives a row address from the address register 23B and decodes the row address. The row decoder 26 performs an operation of selecting a word line or word lines based on the decoded row address. Then, the row decoder 26 transmits the voltages that are necessary for a write operation, a read operation, and an erase operation to the memory cell array 20 via the word lines.

The column decoder 27 receives a column address from the address register 23B and decodes the column address. The column decoder 27 performs an operation of selecting a bit line or bit lines based on the decoded column address.

When a read operation is performed, the sense amplifier unit 28 detects and amplifies data read from a memory cell transistor into a bit line. When a write operation is performed, the sense amplifier unit 28 transmits write data to a bit line.

When a read operation is performed, the data register 29 temporarily stores data transmitted from the sense amplifier unit 28 and transmits the data in series to the input/output circuit 21 (for example, 8 bits at a time). In addition, when a write operation is performed, the data register 29 temporarily stores data transmitted in series from the input/output circuit 21 and transmits the data in parallel to the sense amplifier unit 28. The data register 29 is an SRAM or the like.

A power source voltage VCC and a ground voltage VSS are applied to the NAND flash memory 2 via corresponding terminals.

1-1-2 Configuration of Block BLK

Figure 3:
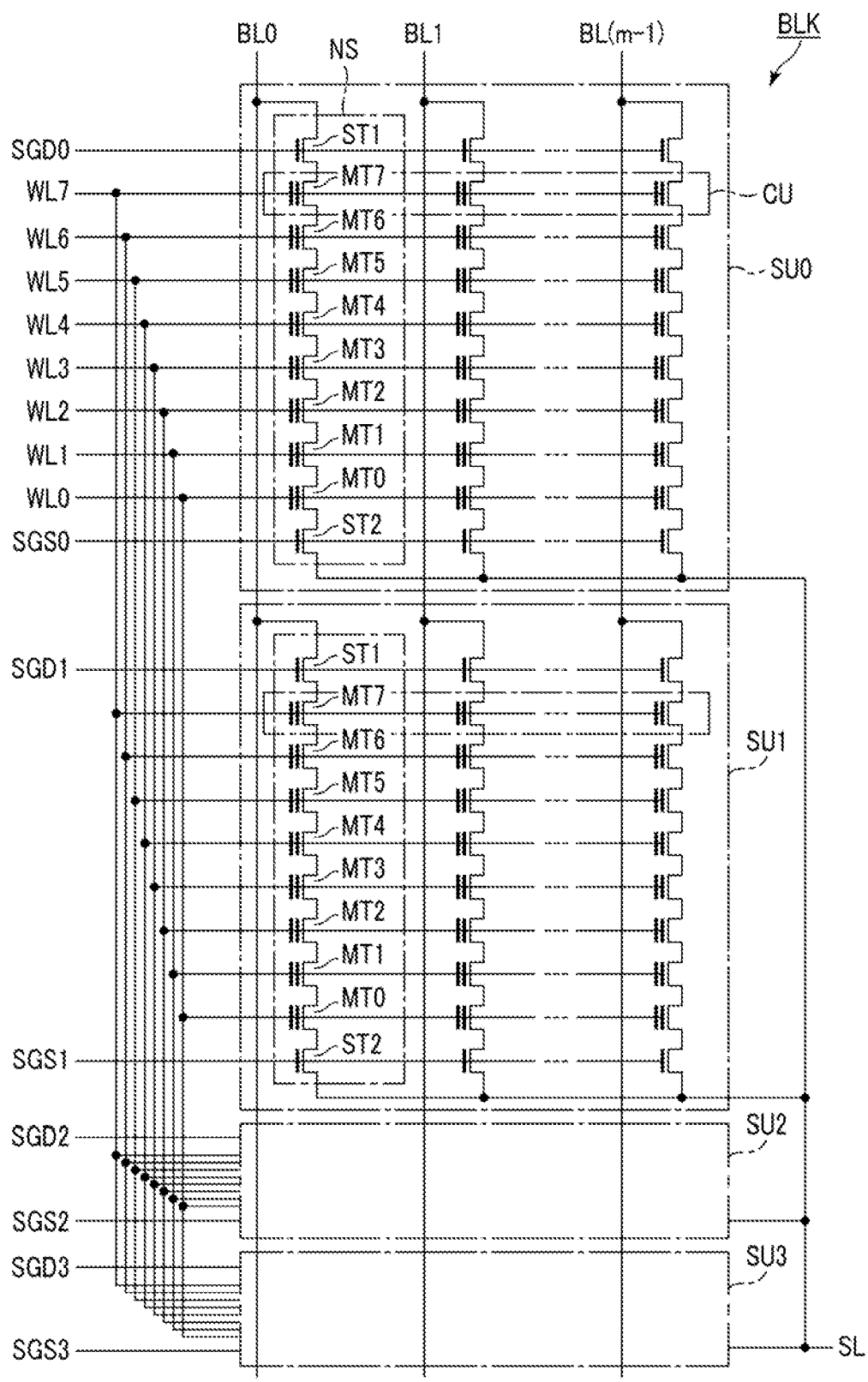
FIG. 3 is a circuit diagram of a block.

FIG. 3 is a circuit diagram of one block BLK. Each of blocks BLK includes string unit SU. In FIG. 3, four string units SU0 to SU3 are illustrated as an example. The total number of string units SU in one block BLK may be arbitrarily set.

Each of the string units SU includes NAND strings NS, also referred to as memory strings. The total number of NAND strings NS in one string unit SU may be arbitrarily set.

Each of the NAND strings NS includes memory cell transistors MT and two select transistors ST1 and ST2. The memory cell transistors MT are connected in series between a source of the select transistor ST1 and a drain of the select transistor ST2. In description presented here, a memory cell transistor may also be referred to as a memory cell or a cell. In FIG. 3, although a configuration example in which the NAND string NS includes eight memory cell transistors MT (MT0 to MT7) is illustrated, in actuality, the number of memory cell transistors MT in a NAND string NS is larger than that and may, in general, be arbitrarily set. Each memory cell transistor MT includes a control gate electrode and a charge storage layer and stores data in a nonvolatile manner. The memory cell transistor MT can store 1-bit data, 2-bit data, or more.

Gates of select transistors ST1 in a string unit SU0 are commonly connected to a select gate line SGD0. Similarly, select gate lines SGD1 to SGD3 are respectively connected to string units SU1 to SU3. Gates of select transistors ST2 in the string unit SU0 are commonly connected to a select gate line SGS0. Similarly, select gate lines SGS1 to SGS3 are respectively connected to the string units SU1 to SU3. In addition, in some examples, a common select gate line may be connected to the string units SU0 to SU3 in each block BLK. Control gates of the memory cell transistors MT0 to MT7 disposed in each block BLK are respectively connected to the word lines WL0 to WL7.

Among NAND strings NS arranged in in each block BLK, drains of select transistors ST1 of NAND strings NS disposed in a same column are commonly connected to one of the bit lines BL0 to BL(m-1). Here, "m" is an integer of one or more. In addition, each bit line BL is commonly connected to additional blocks BLK and is connected to one NAND string NS disposed in each string unit SU provided in each of the blocks BLK. Sources of select transistors ST2 in each block BLK are commonly connected to the source line SL. The source line SL, for example, is commonly connected to blocks BLK.

Data stored in memory cell transistors MT disposed in each block BLK, for example, is erased as a block (in a block unit). Reading and writing are performed on memory cell transistors MT connected to one word line WL disposed in one string unit SU in a block. A set of memory cell transistors MT sharing the word lines in one string unit SU will be referred to as a cell unit CU. A group of 1-bit data stored in each of memory cell transistors MT provided in a cell unit CU will be referred to a page. In other words, a write operation and a read operation for the cell unit CU are performed in units of pages.

The NAND string NS may include dummy cell transistors. More specifically, for example, two dummy cell transistors (not specifically illustrated in the drawing) are connected in series between the select transistor ST2 and the memory cell transistor MT0. In addition, for example, two dummy cell transistors (not specifically illustrated in the drawing) are connected in series between the memory cell transistor MT7 and the select transistor ST1. Dummy word lines are connected to gates of dummy cell transistors. The structure of a dummy cell transistor is the substantially the same as that of a non-dummy memory cell transistor. The dummy cell transistors are not used for storing data but have a function of alleviating disturbances received by the memory cell transistors and the select transistor during a write operation or an erase operation.

1-1-3 Stacked Structure of Block BLK

Figure 4:
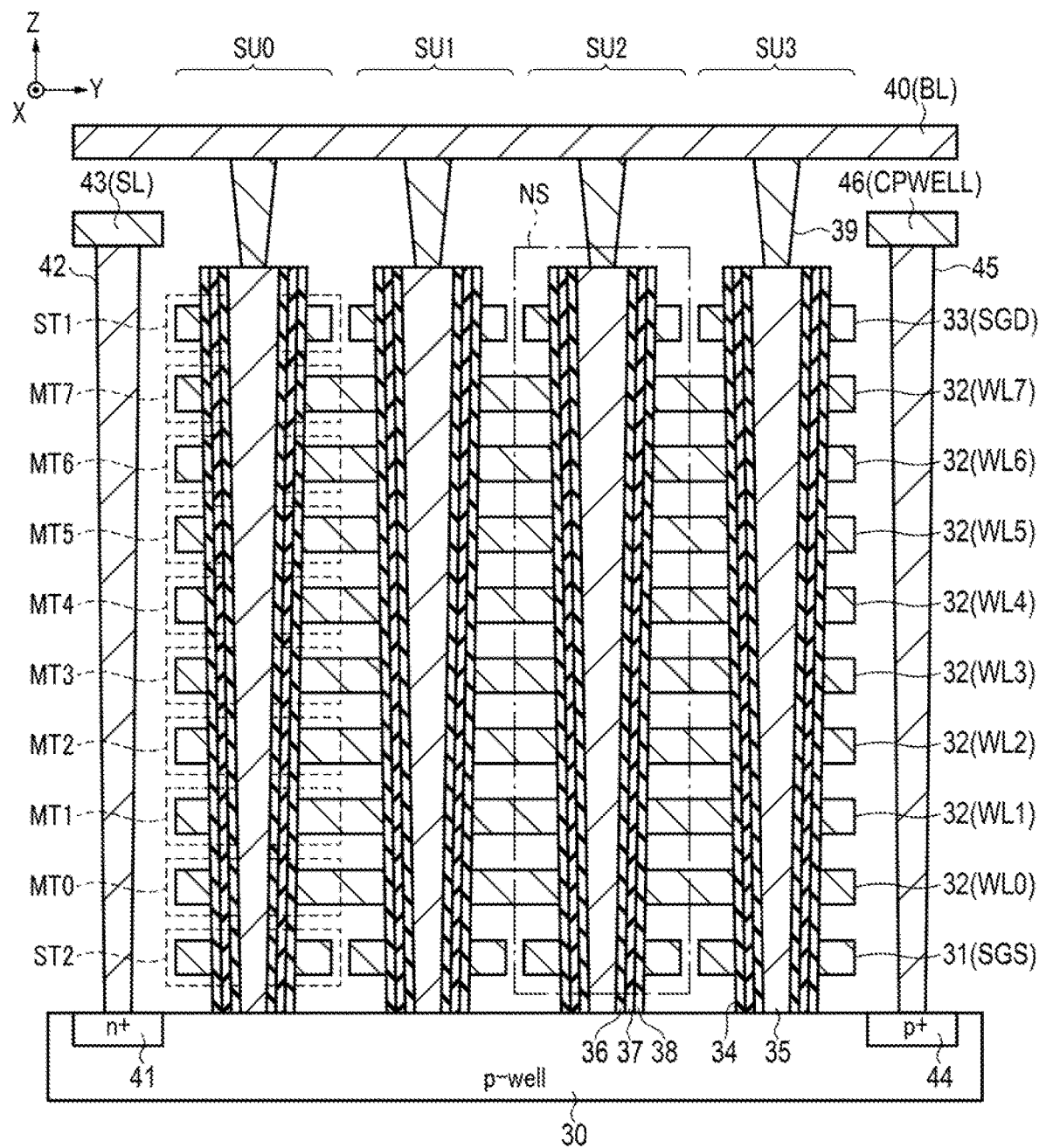
FIG. 4 is a cross-sectional diagram of a partial area of a block.

FIG. 4 is a cross-section diagram of a partial area of a block BLK. In FIG. 4, an X-direction is a direction in which the select gate line extends, a Y-direction that is orthogonal to the X-direction in a horizontal plane is a direction in which bit lines extend, and a Z-direction is a stacking direction.

In a semiconductor layer, a p-well area (p-well) 30 is disposed. The NAND strings NS are disposed on the p-well area 30. In other words, on the well area 30, a wiring layer 31 functioning as a select gate line SGS, eight wiring layers 32, functioning as word lines WL0 to WL7, and a wiring layer 33, functioning as a select gate line SGD, are stacked in this order via insulating layers. In order to avoid representational complications in the drawings, any hatching for depicting the insulating layers between the stacked wiring layers has been omitted.

A memory hole 34 passes through the wiring layers 31, 32, and 33 reaches the well area 30. In the memory hole 34, a semiconductor layer 35 (also referred to as a semiconductor pillar 35) having a pillar shape is disposed. On an outer facing surface of the semiconductor pillar 35, a gate insulating film 36, a charge storage layer 37, which is an insulating layer, and a block insulating film 38 are disposed in this order. The memory cell transistor MT and the select transistors ST1 and ST2 are thus configured. The semiconductor pillar 35 functions as a current path of the NAND string NS and is an area in which a channel of each transistor is formed. An upper end of the semiconductor pillar 35 is connected to a metal wiring layer 40, which is functioning as a bit line BL, via a contact plug 39.

In the surface area of the p-well area 30, there is an $n^+$-type diffusion area 41 into which n-type impurities at a high concentration have been introduced. On the diffusion area 41, a contact plug 42 is disposed, and the contact plug 42 is connected to a metal wiring layer 43, which functions as a source line SL. In addition, in the surface area of the p-well area 30, there is a $p^+$-type diffusion area 44 into which p-type impurities at a high concentration have been introduced. On the diffusion area 44, a contact plug 45 is disposed, and the contact plug 45 is connected to a metal wiring layer 46, functioning as a well wiring CPWELL. The well wiring CPWELL is wiring that is used for applying a voltage to the semiconductor pillar 35 via the well area 30.

The configurations described above are arranged in a depth direction (X-direction), which is into the sheet of FIG. 4, and a string unit SU is configured with a set of NAND strings NS aligned along the X-direction.

1-1-4 Threshold Distribution of Memory Cell Transistor

Figure 5:
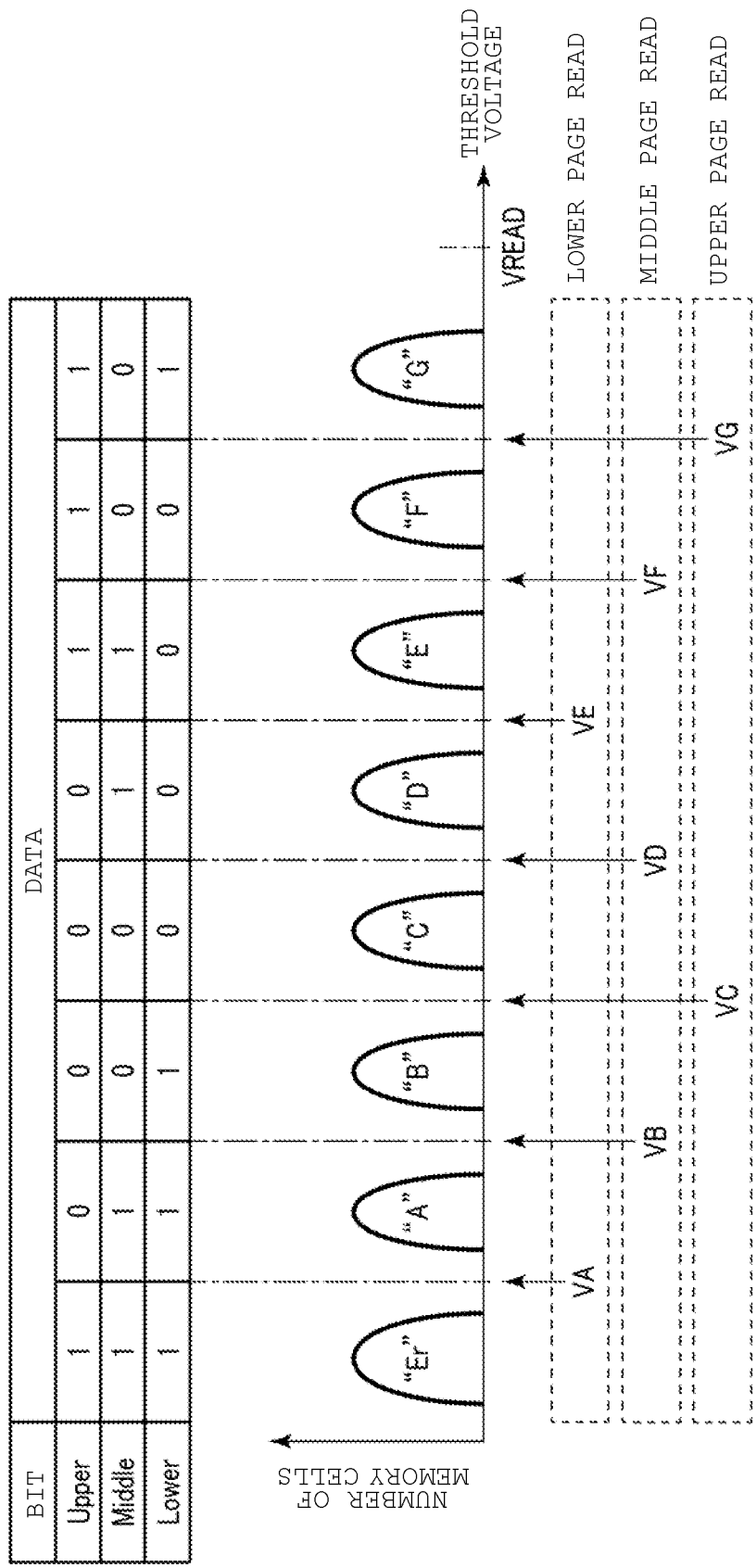
FIG. 5 is a schematic diagram illustrating one example of a threshold distribution of memory cell transistors.

Next, a distribution of threshold voltages Vth taken by memory cell transistors MT will be described. FIG. 5 is a schematic diagram illustrating one example of a threshold distribution of memory cell transistors MT. Each of the memory cell transistors MT can store 2-bit data or more according to differences in threshold voltage levels. In this example, a case in which each memory cell transistor MT stores 3-bit data, a so-called triple level cell (TLC) system, will be described.

The 3-bit data is defined by a lower bit value, a middle bit value, and an upper bit value. When the memory cell transistor MT stores three bits, the memory cell transistor MT can take one of eight states corresponding to different threshold voltages. The eight states will be referred to as states of "Er", "A", "B", "C", "D", "E", "F", and "G" in order of lowest to highest threshold voltage states. The memory cell transistors MT in each of the states of "Er", "A", "B", "C", "D", "E", "F", and "G" form a distribution about a nominal threshold voltage value corresponding to the respective state.

For example, data of "111", "110", "100", "000", "010", "011", "001", and "101" are respectively assigned to states of "Er", "A", "B", "C", "D", "E", "F", and "G". When an upper bit is "X", a middle bit is "Y", and a lower bit is "Z", a bit stream is "X, Y, Z". The assignment or coding of a threshold distribution value and data value may be arbitrarily set.

In order to read data stored in a memory cell transistor MT that is a target for reading, a state to which a threshold voltage of the memory cell transistor MT belongs is determined. In order to determine the state, read voltages VA, VB, VC, VD, VE, VF, and VG are used.

The state "Er", for example, corresponds to a state in which data has been erased (erased state). A threshold voltage of a memory cell transistor MT belonging to the state "Er" is lower than a voltage VA and, for example, has a negative value.

The states of "A" to "G" correspond to states in which electric charge has been injected to the charge storage layer, and data has thus been written in the memory cell transistor MT, and a threshold voltage of memory cell transistors MT belonging to the states of "A" to "G", for example, has a positive value. A threshold voltage of a memory cell transistor MT belonging to the state "A" is higher than the read voltage VA and is a read voltage VB or less. A threshold voltage of a memory cell transistor MT belonging to the state "B" is higher than the read voltage VB and is a read voltage VC or less. A threshold voltage of a memory cell transistor MT belonging to the state "C" is higher than the read voltage VC and is a read voltage VD or less. A threshold voltage of a memory cell transistor MT belonging to the state "D" is higher than the read voltage VD and is a read voltage VE or less. A threshold voltage of a memory cell transistor MT belonging to the state "E" is higher than the read voltage VE and is a read voltage VF or less. A threshold voltage of a memory cell transistor MT belonging to the state "F" is higher than the read voltage VF and is a read voltage VG or less. A threshold voltage of a memory cell transistor MT belonging to the state "G" is higher than the read voltage VG and is lower than a read voltage VREAD.

Here, the read voltage VREAD is a voltage applied to a word line WL connected to a memory cell transistor MT of a cell unit CU that is not a target for reading and is higher than the threshold voltage of a memory cell transistor MT that is in any one of the states. In other words, a memory cell transistor MT having a control gate electrode applied with the voltage VREAD is in an ON state regardless of stored data therein.

As above, each memory cell transistor MT is set to one of the eight states and can store 3-bit data. In addition, read and write is performed in units of pages in one cell unit CU. When a memory cell transistor MT stores 3-bit data, a lower bit, a middle bit, and an upper bit are respectively assigned to three pages in one cell unit CU. Here, pages for which write or read is performed for the lower bit, the middle bit, and the upper bit altogether are respectively referred to as a lower page, a middle page, and an upper page.

In the example illustrated in FIG. 5, by performing read operations using two read voltages VA and VE in reading a lower page, it can be determined whether a lower bit stored in the memory cell transistor MT is data of "1" or data of "0". In addition, by performing read operations using three read voltages VB, VD, and VF in reading a middle page, it can be determined whether a middle bit stored in the memory cell transistor MT is data of "1" or data of "0". By performing read operations using two read voltages VC and VG in reading an upper page, it can be determined whether an upper bit stored in the memory cell transistor MT is data of "1" or data of "0".

In other words, by executing read twice using read voltages of two levels for a lower page, executing read three times using read voltages of three levels for a middle page, and executing read twice using read voltages of two levels for an upper page, 3-bit data stored in a memory cell transistor is finally determined. Such allocation of data is called 2-3-2 coding.

1-1-5 Configuration of Sense Amplifier Unit 28 and Data Register 29

Figure 6:
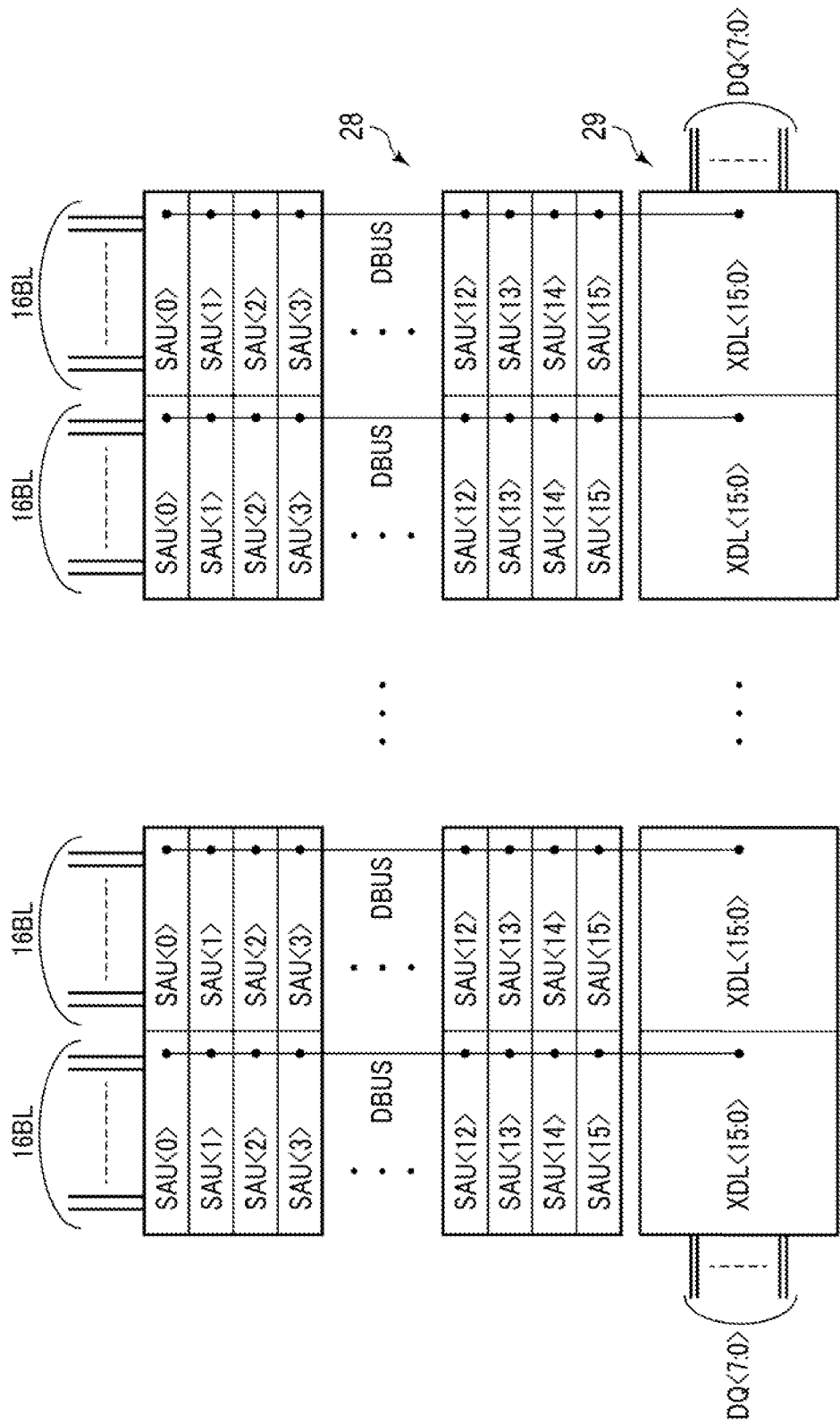
FIG. 6 is a block diagram of a sense amplifier unit and a data register.

FIG. 6 is a block diagram of the sense amplifier unit 28 and the data register 29 illustrated in FIG. 2.

The sense amplifier unit 28 includes sense amplifier units SAU corresponding to the bit lines BL. Each of the sense amplifier units SAU includes a sense amplifier SA and data latch circuits. A specific configuration of the sense amplifier unit SAU will be described later. For example, 16 sense amplifier units SAU<0> to SAU<15> (SAU<15:0>) respectively connected to 16 bit lines BL configure one set. Several such sets are arranged in a row direction.

The data register 29 includes data latch circuits XDL corresponding to the sense amplifier units SAU. There are 16 data latch circuits XDL<15:0> corresponding to 16 sense amplifier units SAU<15:0> in one set. Several sets are arranged in the row direction. "XDL<15:0>" illustrated in FIG. 6 represents 16 data latch circuits XDL.

The 16 sense amplifier units SAU<15:0> are connected to 16 data latch circuits XDL<15:0> via a bus DBUS. For example, one signal line in the bus DBUS is disposed in correspondence with 16 sense amplifier units SAU<15:0> and 16 data latch circuits XDL<15:0>. Each of the 16 sense amplifier units SAU<15:0> can be selectively connected to one of the 16 data latch circuits XDL<15:0> via this one signal line.

The data latch circuits XDL<15:0> are connected to eight signal lines DQ<7:0>. For example, one signal line DQ<0> is connected to two data latch circuits XDL<0> and XDL<8>, one signal line DQ<1> is connected to two data latch circuits XDL<1> and XDL<9>, one signal line DQ<2> is connected to two data latch circuits XDL<2> and XDL<10>, one signal line DQ<3> is connected to two data latch circuits XDL<3> and XDL<11>, one signal line DQ<4> is connected to two data latch circuits XDL<4> and XDL<12>, one signal line DQ<5> is connected to two data latch circuits XDL<5> and XDL<13>, one signal line DQ<6> is connected to two data latch circuits XDL<6> and XDL<14>, and one signal line DQ<7> is connected to two data latch circuits XDL<7> and XDL<15>.

The data latch circuits XDL<15:0> are connected to the input/output circuit 21 via the signal lines DQ<7:0>. The data latch circuits XDL<15:0> temporarily store write data transmitted from the input/output circuit 21 and temporarily stores read data transmitted from the sense amplifier unit SAU. Data transmission between the input/output circuit 21 and the sense amplifier unit 28 is performed via data latch circuits XDL corresponding to one page.

Specific Configuration Example of Sense Amplifier Unit

Figure 7:
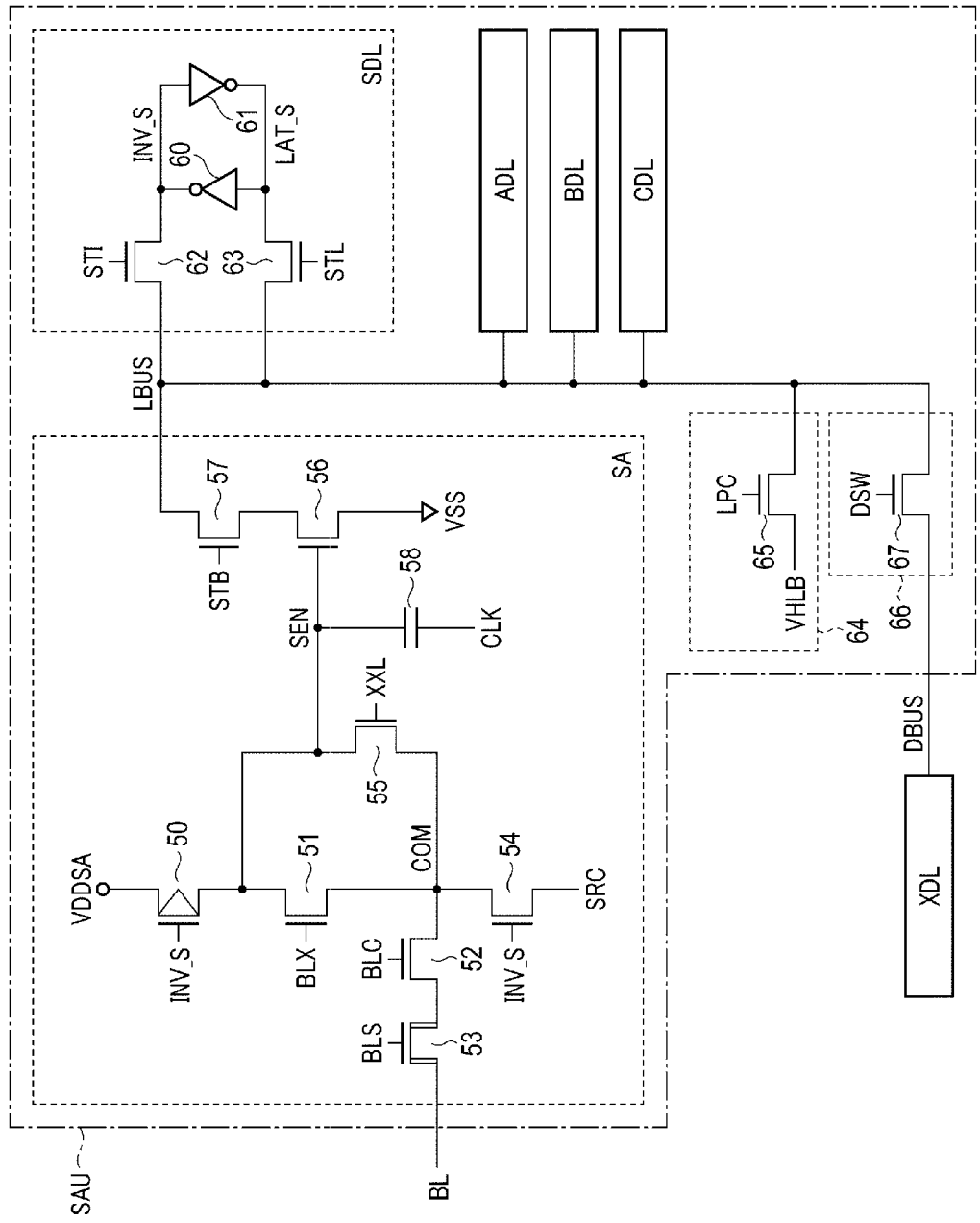
FIG. 7 is a circuit diagram of a sense amplifier unit.

Next, a specific configuration example of the sense amplifier unit SAU will be described. FIG. 7 is a circuit diagram of the sense amplifier unit SAU illustrated in FIG. 6. The signals supplied to the sense amplifier unit SAU are generated by the sequencer 24.

The sense amplifier unit SAU includes a sense amplifier SA and data latch circuit ADL, BDL, CDL, and SDL. The sense amplifier SA and the data latch circuits ADL, BDL, CDL, and SDL are connected such that data can be mutually transmitted.

The data latch circuits ADL, BDL, CDL, and SDL temporarily store data. When a write operation is performed, the sense amplifier SA controls the voltage of the bit line BL according to data stored in the data latch circuit SDL. The data latch circuits ADL, BDL, and CDL are used for a multi-value operation of the memory cell transistors MT storing 2-bit data or more (more specifically, for example, three bits). In other words, the data latch circuit ADL is used for storing a lower page. The data latch circuit BDL is used for storing a middle page. The data latch circuit CDL is used for storing an upper page. The number of data latch circuits in the sense amplifier unit SAU can be changed according to the number of bits stored by each memory cell transistor MT.

When a read operation is performed, the sense amplifier unit SA detects data read into a corresponding bit line BL and determines data as "0" or "1". In addition, when a write operation is performed, the sense amplifier SA applies a voltage to a bit line BL based on write data.

The sense amplifier SA, for example, includes a p-channel MOS transistor 50, n-channel MOS transistors 51 to 57, and a capacitor 58.

A power source voltage VDDSA used for a sense amplifier is supplied to a power source terminal of the sense amplifier SA. The power source voltage VDDSA for a sense amplifier is generated using the power source voltage VCC of the NAND flash memory 2 by using the voltage generating circuit 25.

A source of the transistor 50 is connected to the power source terminal to which the power source voltage VDDSA for a sense amplifier is supplied, a drain thereof is connected to a node SEN, and a gate thereof is connected to a node INV_S disposed in the data latch circuit SDL. A drain of the transistor 51 is connected to the node SEN, a source thereof is connected to a node COM, and a signal BLX is input to a gate thereof.

A drain of the transistor 52 is connected to the node COM, and a signal BLC is input to a gate thereof. A drain of the transistor 53 is connected to the source of the transistor 52, a source thereof is connected to a corresponding bit line BL, and a signal BLS is input to a gate thereof. The transistor 53 is a MOS (metal-oxide-semiconductor) transistor having a high breakdown voltage.

A drain of the transistor 54 is connected to the node COM, a source thereof is connected to a node SRC, and a gate thereof is connected to the node INV_S. For example, the ground voltage VSS or a voltage VSRC is applied to the node SRC. A drain of the transistor 55 is connected to the node SEN, a source thereof is connected to the node COM, and a signal XXL is input to a gate thereof.

A source of the transistor 56 is connected to a ground terminal to which the ground voltage VSS is supplied, and a gate thereof is connected to the node SEN. A source of the transistor 57 is connected to the drain of the transistor 56, a drain thereof is connected to a bus LBUS, and a signal STB is input to a gate thereof. The signal STB is used for controlling the timing at which data read into a bit line BL is determined.

One electrode of the capacitor 58 is connected to the node SEN, and a clock signal CLK is input to the other electrode of the capacitor 58.

The data latch circuit SDL includes inverters 60 and 61 and n-channel MOS transistors 62 and 63. An input terminal of the inverter 60 is connected to a node LAT_S, and an output terminal thereof is connected to the node INV_S. An input terminal of the inverter 61 is connected to the node INV_S, and an output terminal thereof is connected to the node LAT_S. One end of the transistor 62 is connected to the node INV_S, the other end thereof is connected to the bus LBUS, and a signal STI is input to the gate. One end of the transistor 63 is connected to the node LAT_S, the other end thereof is connected to the bus LBUS, and a signal STL is input to a gate thereof. For example, data maintained at the node LAT_S corresponds to data stored by the data latch circuit SDL, and data maintained at the node INV_S corresponds to inverted data of data maintained at the node LAT_S. The circuit configuration of each of the data latch circuits ADL, BDL, CDL, and TDL is similar to the circuit configuration of the data latch circuit SDL, and thus, further description thereof will not be presented here.

The sense amplifier unit SAU includes a pre-charge circuit 64 and a bus switch 66.

The pre-charge circuit 64 pre-charges the bus LBUS. The pre-charge circuit 64 includes an n-channel MOS transistor 65. A drain of the transistor 65 is connected to the bus LBUS, a voltage VHLB for pre-charging is applied to a source thereof, and a signal LPC is input to a gate thereof. The pre-charge circuit 64 pre-charges the bus LBUS by transmitting the voltage VHLB to the bus LBUS.

The bus switch 66 connects the bus LBUS and the bus DBUS. The bus LBUS is connected to the data latch circuit XDL in the data register 29. The bus switch 66, for example, includes an n-channel MOS transistor 67. One end of the transistor 67 is connected to the bus LBUS, the other end thereof is connected to the bus DBUS, and a signal DSW is input to a gate thereof.

1-2 Operation

The operation of the memory system 1 configured as described above will be described.

1-2-1 Read Mode

In this embodiment, the NAND flash memory 2 can execute two different types of reads (referred to as read modes). A first read mode is an all-bit-line (ABL) read mode and a second read mode is a shielded bit line (SBL) read mode.

The ABL read mode is a mode in which all bit lines BL are charged to a predetermined bit line voltage, and data is read from all the bit lines BL. The ABL read mode has an advantage of reading many bits at once.

The SBL read mode is a mode in which data is separately read from one of a group of even-numbered bit lines BL or a group of odd-numbered bit lines BL, and a shielding voltage is applied to the other group not presently being read. Thus, a bit line adjacent to a bit line BL that is a target for reading data functions as a shield line. In this embodiment, an example of a case in which a shielding bit line is provided as every other bit line in the array. However, shielding bit line does not necessarily need to be disposed as every other line, and two or more bit lines BL adjacent to each other may be used as shielding bit lines. The SBL read mode, in general, has an advantage of reducing coupling noise induced in a bit line that is a target for reading (also referred to as a selected bit line). It is readily apparent that the number of bits that can be read at once is smaller in the SBL read mode than in the ABL read mode.

Figure 8:
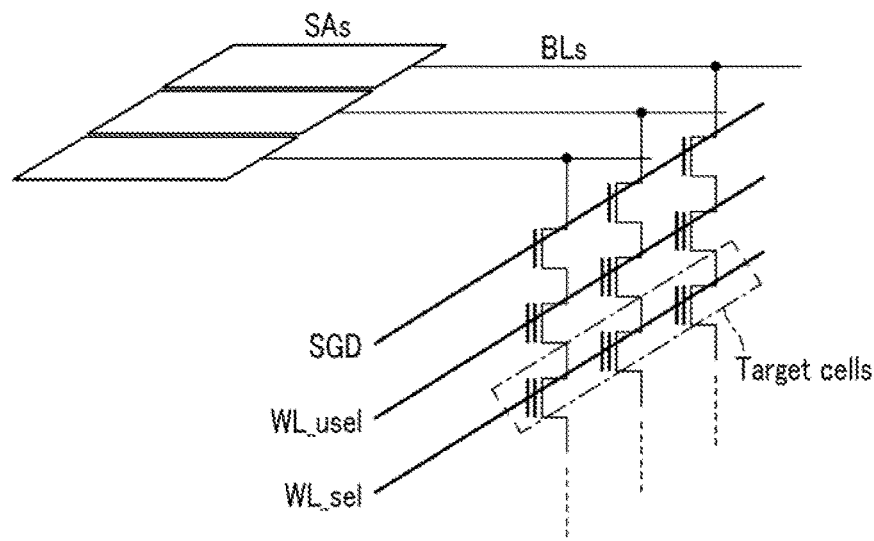
FIG. 8 is a schematic diagram illustrating aspects of an ABL read operation.

FIG. 8 is a schematic diagram illustrating an ABL read operation. In FIG. 8, three sense amplifiers SA, three bit lines BL, a select gate line SGD, a non-selected word line WL_usel, and a selected word line WL_sel are illustrated. In the ABL read operation, all the memory cell transistors (cells) that are connected to the selected word line WL_sel and are electrically connected to the bit line BL using the select gate line SGD and are targets for reading.

Figure 9:
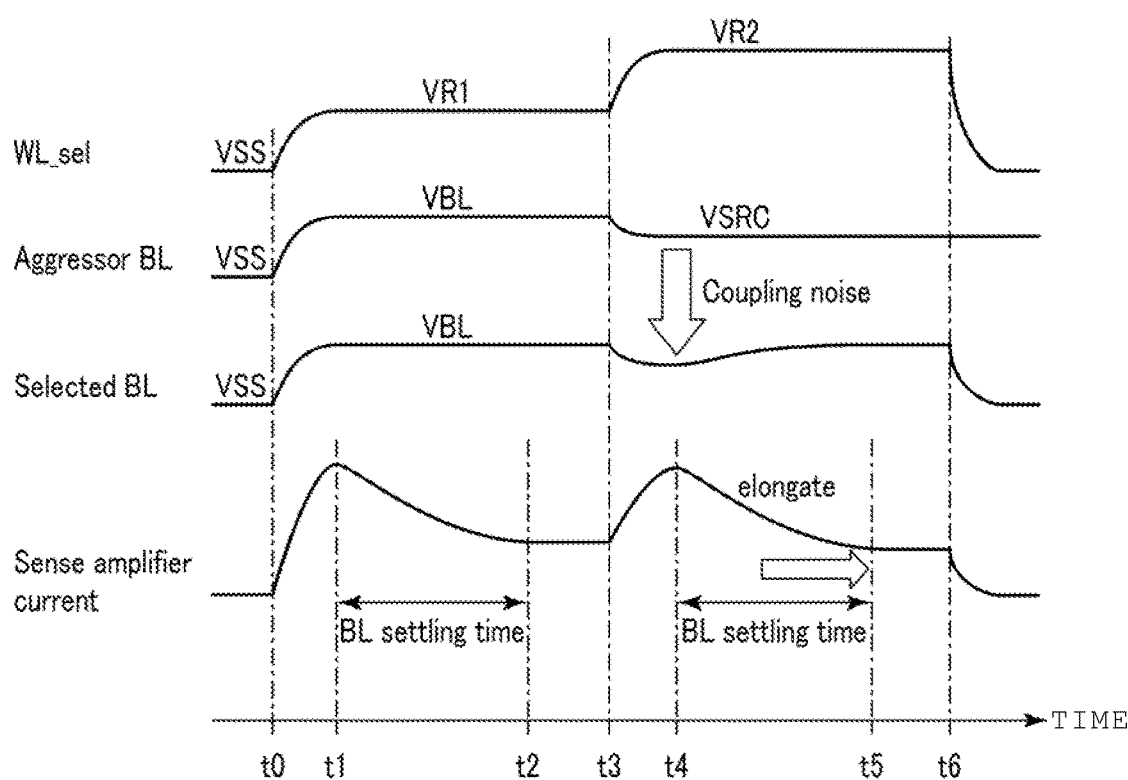
FIG. 9 is a timing diagram illustrating aspects of the ABL read operation.

FIG. 9 is a timing diagram illustrating an ABL read operation. FIG. 9 illustrates one example of voltage waveforms of a selected word line WL_sel, an aggressor bit line BL, and a selected bit line BL. In this embodiment, the aggressor bit line represents a bit line BL that is closest to the selected bit line BL among bit lines BL connected to a cell that is a target for reading. In the ABL read mode, read is performed using all the bit lines BL, and thus, a bit line adjacent to the selected bit line BL is an aggressor bit line BL.

The aggressor bit line BL may be a source of noise for the selected bit line BL. For example, for a certain read voltage, when a cell connected to a selected bit line BL is on, and a cell connected to an aggressor bit line BL is off, the electric potential on the selected bit line BL also decreases due to coupling noise caused by the aggressor bit line BL.

FIG. 9 illustrates a consumed current of a sense amplifier SA (also called a sense amplifier current) supplying a current to the selected bit line BL. A sense amplifier current is a current flowing from the sense amplifier SA via the bit line BL and corresponds to a current flowing via the power source terminal (the terminal to which the power source voltage VDDSA is supplied for a sense amplifier) of the sense amplifier SA or a current ICC flowing via the power source terminal of the NAND flash memory 2 (a terminal to which the power source voltage VCC of the NAND flash memory 2 is supplied).

At time t0, the row decoder 26 applies a read voltage VR1 to the selected word line WL_sel. The sense amplifier unit 28 applies a voltage VBL (>VSS) to all the bit lines (including a selected bit line BL and an aggressor bit line BL). In addition, a voltage VREAD is applied to a non-selected word line. The select transistors ST1 and ST2 are in the ON state. For example, a voltage VSRC that is lower than the voltage VBL and is the ground voltage VSS or more is applied to the source line SL.

In a period of t1 to t2 (a BL settling time), the sense amplifier current settles to a predetermined level after an initial increase (overshoot). Thereafter, the sense amplifier unit 28 determines the electric potentials of all the bit lines.

At time t3, the electric potential of the aggressor bit line BL decreases to the voltage VSRC. Then, due to coupling noise caused by the aggressor bit line BL, the electric potential of the selected bit line BL also decreases. In addition, the row decoder 26 applies a read voltage VR2 (>VR1) to the selected word line WL_sel.

In a period of t4 to t5 (a BL settling time), the sense amplifier current is settles down to a predetermined level after an initial increase. In the ABL read mode, the period of t4 to t5 is generally long. Thereafter, the sense amplifier unit 28 determines the electric potentials of all the bit lines. At time t6, the electric potential of each signal line is reset.

Figure 10:
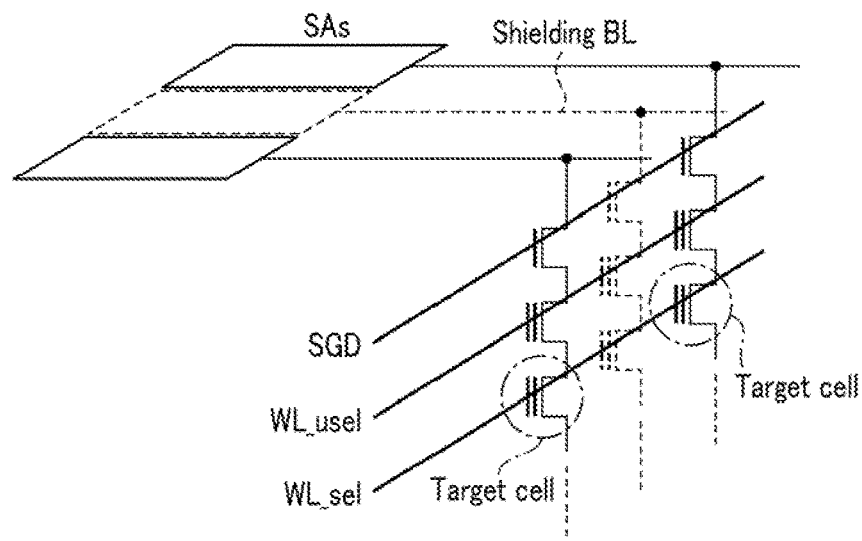
FIG. 10 is a schematic diagram illustrating aspects of an SBL read operation

FIG. 10 is a schematic diagram illustrating an SBL read operation. In FIG. 10, three sense amplifiers SA, three bit lines BL, a select gate line SGD, a non-selected word line WL_usel, and a selected word line WL_sel are illustrated. The bit line BL denoted using a broken line in FIG. 10 is a shielding bit line (shielding BL). Memory cell transistors (cells) connected to bit lines other than the shielding bit line are targets for reading.

Figure 11:
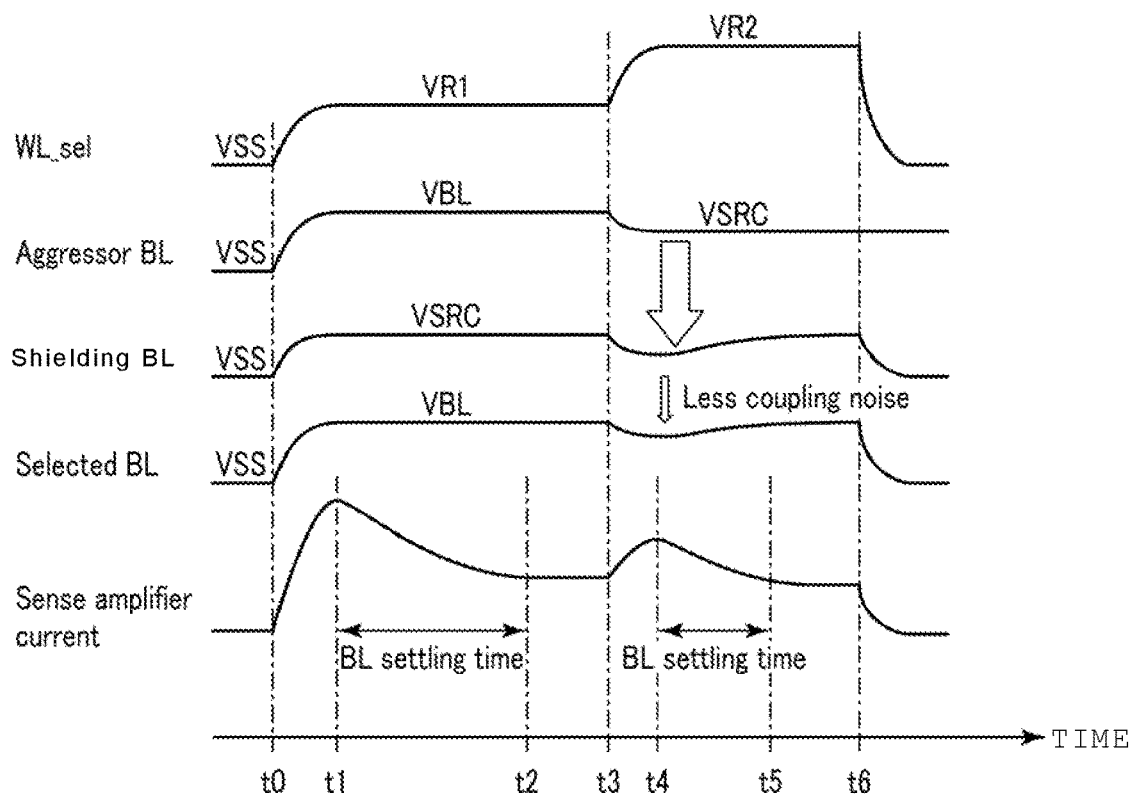
FIG. 11 is a timing diagram illustrating aspects of the SBL read operation.

FIG. 11 is a timing diagram illustrating an SBL read operation. FIG. 11 illustrates one example of voltage waveforms of a selected word line WL_sel, an aggressor bit line BL, a shielding bit line BL, and a selected bit line BL. As described above, when an SBL read operation is performed, every other bit line is a shielding bit line. Thus, a bit line adjacent to the shielding bit line BL is an aggressor bit line BL. The shielding bit line BL is disposed between the aggressor bit line BL and the selected bit line BL. In addition, FIG. 11 illustrates a consumed current (sense amplifier current) of the sense amplifier SA supplying a current to the selected bit line BL.

At time t0, the row decoder 26 applies a read voltage VR1 to the selected word line WL_sel. The sense amplifier unit 28 applies a voltage VBL to the selected bit line BL and the aggressor bit line BL and applies a voltage VSRC to the shielding bit line BL. The voltage VSRC is a voltage applied to the source line SL at the time of performing a read operation and is the ground voltage VSS (0 V) or more and is lower than the voltage VBL. In addition, a voltage VREAD is applied to non-selected word lines. In a NAND string connected to the shielding bit line, the select transistor ST1 is in the ON state, and the select transistor ST2 is in the OFF state. In a NAND string connected to a bit line other than the shielding bit line, the select transistors ST1 and ST2 are in the ON state. A voltage VSRC is applied to the source line SL.

In a period of t1 to t2 (BL settling time), the sense amplifier current settles down to a predetermined level after an initial increase. Thereafter, the sense amplifier unit 28 determines the electric potential of a bit line that is a target for reading.

At time t3, the electric potential of the aggressor bit line BL decreases up to the voltage VSRC. Then, due to coupling noise caused by the aggressor bit line BL, the electric potential of the shielding bit line BL decreases. Since the shielding bit line BL decreases the coupling noise, a voltage drop in the selected bit line BL is kept low. In addition, the row decoder 26 applies a read voltage VR2 (>VR1) to the selected word line WL_sel.

In a period of t4 to t5 (BL settling time), the sense amplifier current settles down to a predetermined level after an initial increase. In the SBL read mode, the period of t4 to t5 is generally shorter than in the ABL read mode. Thereafter, the sense amplifier unit 28 determines the electric potential of a bit line that is a target for reading. At time t6, the electric potential of each signal line is reset.

Here, for increasing speed of a read operation, it is commonly considered to read 8 kilobytes (KB) or 4 KB is performed in the SBL read mode in a NAND flash memory reading one page (for example 16 KB) in the ABL read mode. However, in the SBL read mode, when a read voltage has two levels, the speed of the read operation may not be higher than that in the ABL read mode.

While the voltage VBL is applied to all the bit lines in the ABL read mode, in the SBL read mode, the voltage VBL is applied to only the selected bit lines BL (including the aggressor bit line BL), and the voltage VSRC (<VBL) is applied to the shielding bit line BL. When the voltage of the selected bit line BL is increased up to the voltage VBL while the shielding bit line BL is set to the voltage VSRC, the shielding bit line BL operates as parasitic capacitance as seen from the selected bit line BL. Accordingly, in the (first) read operation at the first read level in the SBL read mode, for example, the amount of electric charge charged in the bit line increases to be five times that in the ABL read mode. For example, in a case in which the peak current of the consumed current ICC (a current flowing via the terminal to which the power source voltage VCC of the NAND flash memory 2 is supplied) is controlled, the charging time of the bit line is longer in the SBL read mode than in the ABL read mode. Thus, an SBL read operation may be slower than an ABL read operation.

In a read operation at second read level and subsequent read levels in the SBL read mode, with the effect of shielding an adjacent bit line, a waiting time until coupling noise decreases is shortened, and the speed of the read operation is higher in the SBL read mode than in the ABL read mode. Thus, when the read voltage is at the first level or the second level, in a case in which a read time of the first level is long in the SBL read mode, the speed of a read operation overall may not be higher than that in the ABL read mode as a whole.

In consideration of the situations described above, a technique is proposed in which, when the read voltage is in the first level or the second level, even when a command for reading 8 KB or 4 KB is executed, an ABL read mode is employed rather than an SBL read mode. It is apparent that the number of bits of data output to the outside of a chip is 8 KB or 4 KB. In other words, when read of 8 KB or 4 KB is performed, and read of the first level or the second level is to be performed, the ABL read mode is executed. On the other hand, when read of 8 KB or 4 KB is performed, and reading at a third or higher level is to be performed, the SBL read mode is executed. By employing such a technique, the speed of a read operation as a whole can be made higher than that of a case of just reading 16 KB in the ABL read mode of the related art or read of 8 KB or 4 KB only in the SBL read mode.

As described above, in the sense amplifier SA, the source of the transistor 50 is connected to the power source terminal to which the power source voltage VDDSA for a sense amplifier is supplied, and the source of the transistor 54 is connected to the ground voltage VSS or the node SRC to which the voltage VSRC is applied. Then, the gate of the transistor 50 is connected to the node INV_S disposed in the data latch circuit SDL, and the source of the transistor 54 is connected to the node INV_S disposed in the data latch circuit SDL.

When an ABL read operation is performed, the nodes INV_S disposed in the data latch circuits SDL of all the sense amplifier units SAU in the sense amplifier unit 28 are set to be in the "L" level in advance. Thus, in each of the sense amplifiers SA of all the sense amplifier units SAU in the sense amplifier unit 28, the transistor 50 is on, and the transistor 54 is off, and the power source voltage VDDSA is supplied to the sense amplifier SA. Accordingly, all the bit lines are selected bit lines BL (or aggressor bit lines BL).

When an SBL read operation is performed, the nodes INV_S disposed in the data latch circuits SDL of all the sense amplifier units in the sense amplifier unit 28 are alternately set to be in the "H" level and the "L" level in advance. Thus, in a sense amplifier SA corresponding to the data latch circuit SDL in which the node INV_S is set to be in the "L" level, the transistor 50 is on, the transistor 54 is off, and the power source voltage VDDSA is supplied to the sense amplifier SA. A bit line connected to the sense amplifier SA becomes a selected bit line BL (or an aggressor bit line BL). On the other hand, in a sense amplifier SA corresponding to the data latch circuit SDL in which the node INV_S is set to be in the "H" level, the transistor 50 is off, the transistor 54 is on, and the ground voltage VSS or the voltage VSRC is applied to the sense amplifier SA. A bit line connected to the sense amplifier SA becomes a shielding bit line BL.

1-2-2 Read Operation

Figure 12:
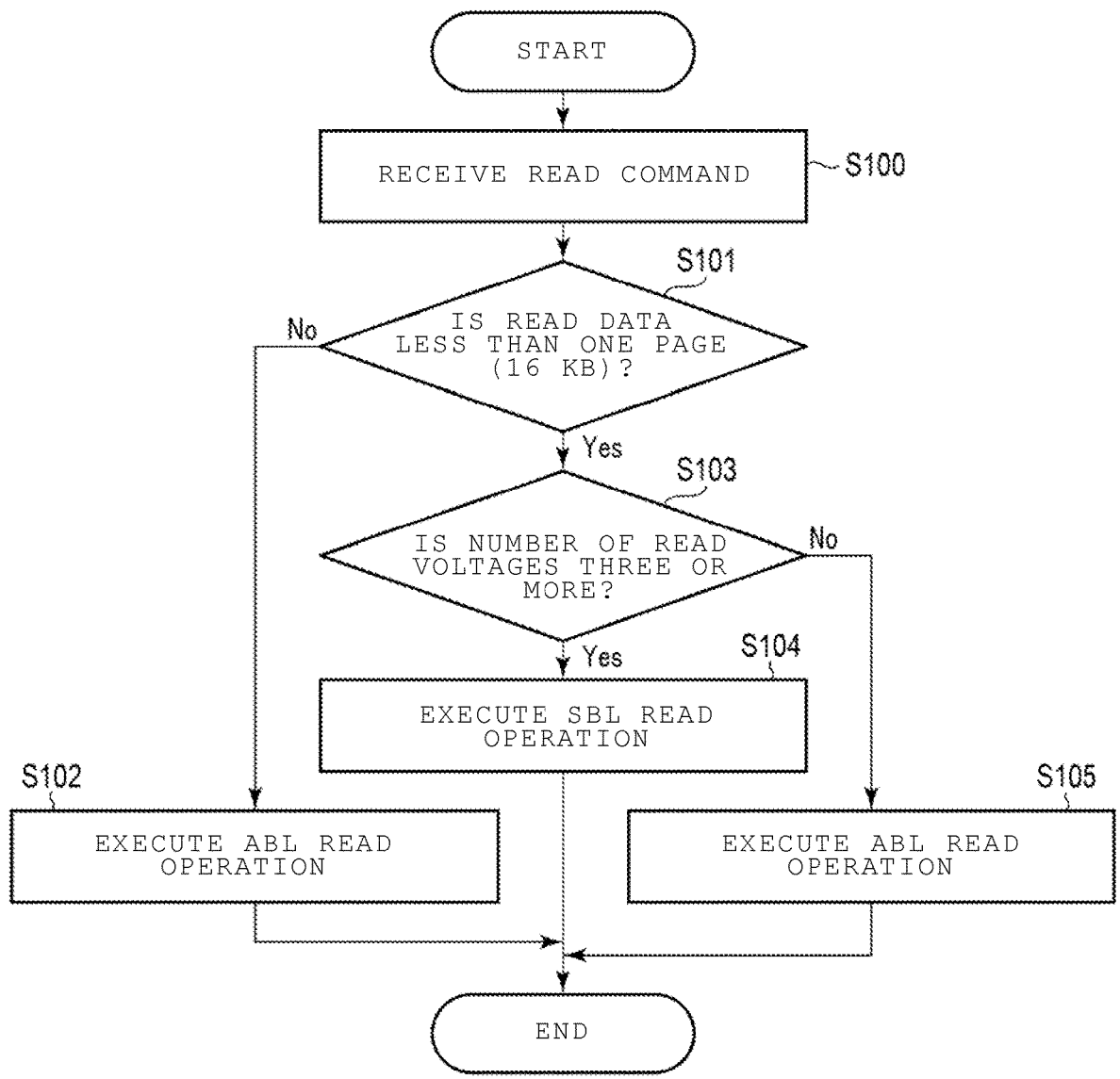
FIG. 12 is a flowchart illustrating aspects of a read operation according to the first embodiment.

Next, a read operation according to the first embodiment will be described. The first embodiment uses the 2-3-2 coding described above as an example. FIG. 12 is a flowchart of a read operation according to the first embodiment.

Here, one page is assumed to be 16 KB in size. The NAND flash memory 2 can execute an operation of reading one page (16 KB) (this will be referred to as a 16 KB read) or an operation of reading data having a less than one page worth of bits (data having a short data length, that is, less than one page in size). The data less than one page in size, is 8 KB data, 4 KB data, or the like. In this example, data having a smaller number of bits than one page is assumed to be 8 KB data, and reading thereof will be referred to as an 8 KB read. Whether a read operation is 16 KB read or 8 KB read can be designated by the memory controller 3 using an address.

The memory controller 3 issues a read command. The NAND flash memory 2 receives the read command from the memory controller 3 (Step S100). This read command includes a read command and an address. The read command includes a command to designate a page type as one of a lower page, a middle page, or an upper page.

The sequencer 24 determines whether or not read data is smaller than one page (16 KB), in other words, whether a 16 KB read or an 8 KB read is to be performed according to the read command (Step S101). In the case of 16 KB read (Step S101=No), the sequencer 24 executes an ABL read operation (Step S102). The ABL read operation is as illustrated in FIGS. 8 and 9. In other words, in Step S102, as usual, one page is read in the ABL read mode.

In the case of 8 KB read (Step S101=Yes), the sequencer 24 determines whether or not the number of read voltages is three or more (Step S103). In Step S103, the determination is made using the type of coding and the type of page (a lower page, a middle page, or an upper page). The type of page is determined using the command.

In a case in which the number of read voltages is three or more (Step S103=Yes), in other words, in the case of a middle page read, the sequencer 24 executes an SBL read operation (Step S104). The SBL read operation is as illustrated in FIGS. 10 and 11.

On the other hand, in a case in which the number of read voltages is smaller than three (Step S103=No), in other words, in the case of a lower page read or an upper page read, the sequencer 24 executes an ABL read operation (Step S105).

The lower page read, the middle page read, and the upper page read for an 8 KB read will be described below.

Lower Page Read

Figure 13:
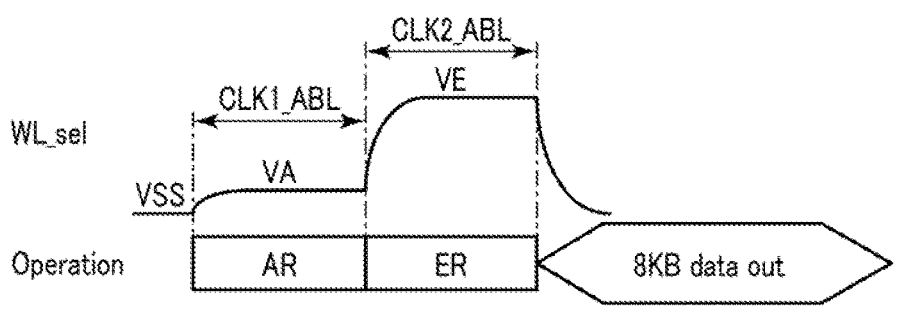
FIG. 13 is a timing diagram for a lower page read according to the first embodiment.

FIG. 13 is a timing diagram illustrating the lower page (LP) read. In FIG. 13, a voltage of a selected word line WL_sel and an operation according thereto are illustrated.

As described above, in the lower page read, a read operation is executed using two read voltages VA and VE. A read operation (AR) using the read voltage VA is an operation of determining whether or not the state of the memory cell transistor is "A" or more. A read operation (ER) using the read voltage VE is an operation of determining whether or not the state of the memory cell transistor is "E" or more.

In the lower page read, an ABL read mode is executed. In the read operation AR, the row decoder applies the read voltage VA to the selected word line WL_sel. In the read operation ER, the row decoder applies the read voltage VE to the selected word line WL_sel. A time required for the read operation AR will be denoted as CLK1_ABL, and a time required for the read operation ER will be denoted as CLK2_ABL.

In the lower page read, 16 KB data is read from the memory cell array, is stored in the data latch circuit SDL in the sense amplifier unit 28, is transmitted to the data latch circuit XDL in the data register 29, and is stored in the data latch circuit XDL. The sequencer 24 outputs 8 KB data designated by an address among 16 KB data stored in the data latch circuit XDL in the data register 29 to the memory controller 3.

In addition, the memory controller 3 can output data stored in the data stored in the data latch circuit XDL at any timing. More specifically, the memory controller 3 issues a first data output command "05h", a column address, and a second data output command "E0" to the NAND flash memory 2. The NAND flash memory 2 outputs data stored in the latch circuit XDL to the memory controller 3 in response to the command sequence. Accordingly, 8 KB data not output to the memory controller 3 can be further output to the memory controller 3 as necessary.

In a case in which the ABL read mode is executed, only 8 KB data designated by an address may be stored in the data latch circuit SDL in the sense amplifier unit 28. In other words, the operation of a sense amplifier SA corresponding to only 8 KB data not designated by the address maybe locked out. Alternatively, 8 KB data not designated by the address, after being stored in the latch circuit SDL, may be controlled not to be transmitted to the latch circuit XDL.

Middle Page Read

Figure 14:
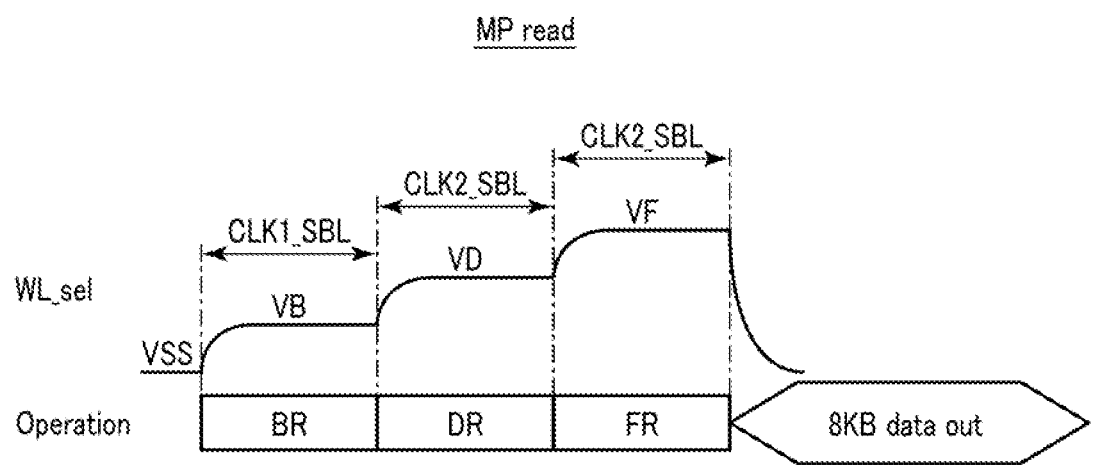
FIG. 14 is a timing diagram for a middle page read according to the first embodiment.

FIG. 14 is a timing diagram illustrating middle page (MP) read.

As described above, in the middle page read, a read operation is executed using three read voltages VB, VD, and VF. A read operation (BR) using the read voltage VB is an operation of determining whether or not the state of the memory cell transistor is "B" or more. A read operation (DR) using the read voltage VD is an operation of determining whether or not the state of the memory cell transistor is "D" or more. A read operation (FR) using the read voltage VF is an operation of determining whether or not the state of the memory cell transistor is "F" or more.

In the middle page read, an SBL read mode is executed. In the read operation BR, the row decoder applies the read voltage VB to the selected word line WL_sel. In the read operation DR, the row decoder applies the read voltage VD to the selected word line WL_sel. In the read operation FR, the row decoder applies the read voltage VF to the selected word line WL_sel. A time required for the read operation BR will be denoted as CLK1_SBL, and a time required for the read operation FR will be denoted as CLK2_SBL. Thereafter, the sequencer 24 outputs 8 KB data to the memory controller 3.

Upper Page Read

Figure 15:
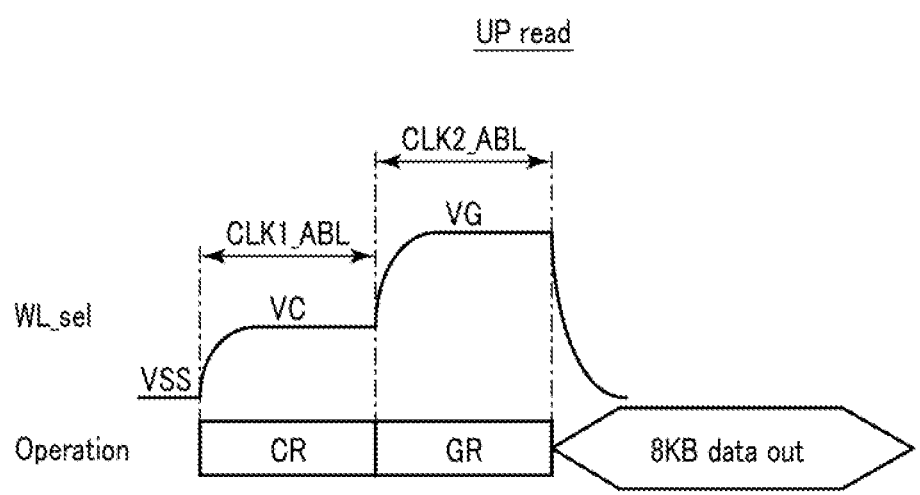
FIG. 15 is a timing diagram for an upper page read according to the first embodiment.

FIG. 15 is a timing diagram illustrating upper page (UP) read.

As described above, in the upper page read, a read operation is executed using two read voltages VC and VG. A read operation (CR) using the read voltage VC is an operation of determining whether or not the state of the memory cell transistor is "C" or more. A read operation (GR) using the read voltage VG is an operation of determining whether or not the state of the memory cell transistor is "G".

In the upper page read, an ABL read mode is executed. In the read operation CR, the row decoder applies the read voltage VC to the selected word line WL_sel. In the read operation GR, the row decoder applies the read voltage VG to the selected word line WL_sel. A time required for the read operation GR is denoted as CLK1_ABL, and a time required for the read operation GR is denoted as CLK2_ABL.

In the upper page read, 16 KB data is read from the memory cell array. The sequencer 24 outputs 8 KB data designated by an address among 16 KB data to the memory controller 3.

Here, with the shielding effect, the relation of "CLK2_SBL <CLK2_ABL" is generally satisfied. On the other hand, as described above, the relation of "CLK1_SBL >CLK1_ABL" maybe satisfied. In such cases, according to this embodiment, in the middle page read, the read time can be made shorter than that in the ABL read mode. In addition, in the lower page read and the upper page read, the read time can be made shorter than that in the SBL read mode. Accordingly, for an 8 KB read, the required read time can be shortened.

1-2-3 Example of Shielding Bit Line

Figure 16:
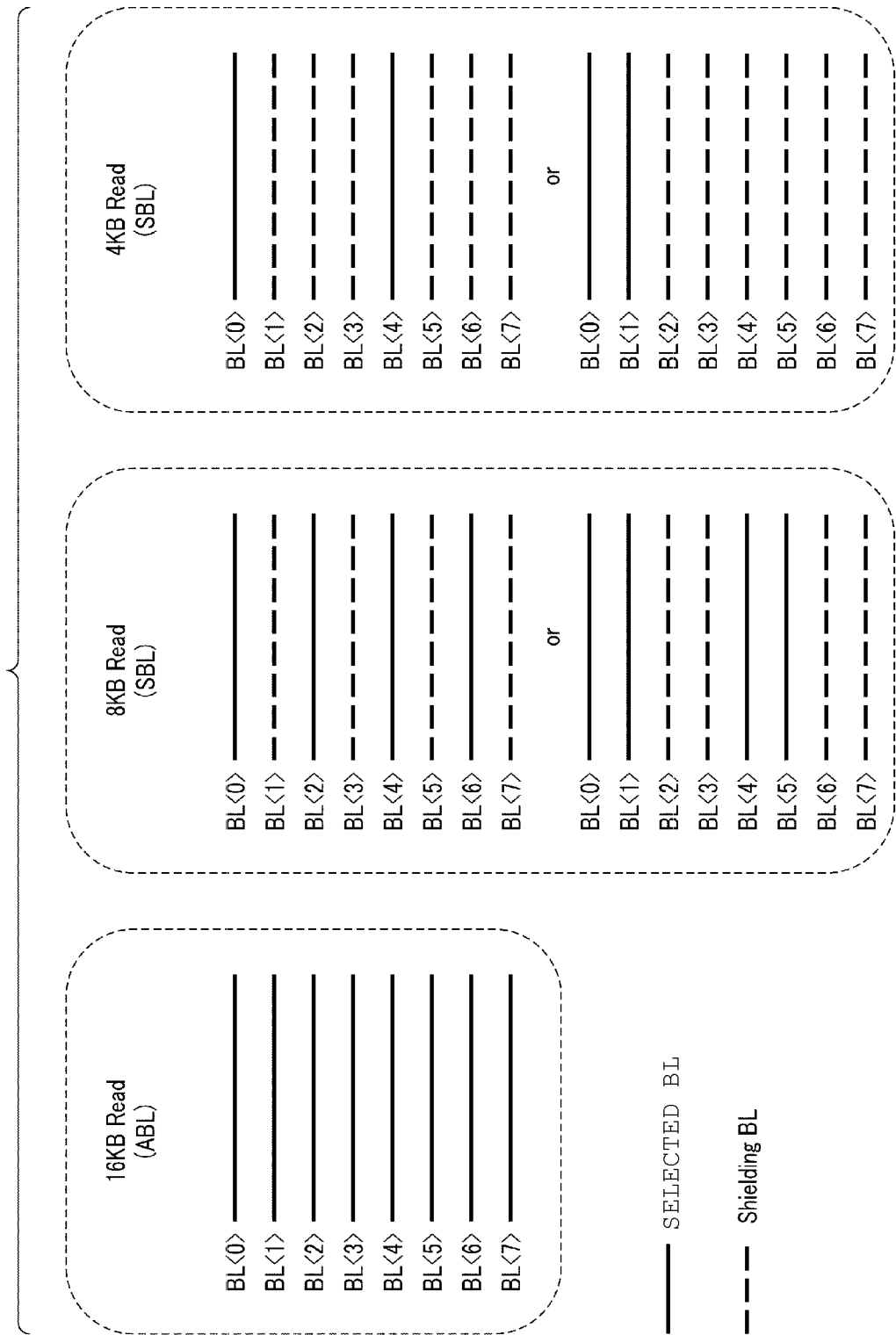
FIG. 16 is a schematic diagram illustrating shielding bit lines.

Next, an example of the shielding bit lines will be described. FIG. 16 is a schematic diagram illustrating an arrangement of shielding bit lines in an array. In FIG. 16, eight bit lines BL<0> to <7> adjacent to each other are depicted. In FIG. 16, a solid line represents a selected bit line, and a broken line represents a shielding bit line. The selected bit line is a bit line that is a target for reading.

In the case of 16 KB reads and the ABL read mode, bit lines BL<0> to BL<7> are all selected bit lines. This similarly the case for 8 KB reads and the ABL read mode.

In the case of 8 KB reads and the SBL read mode, a selected bit line and a shielding bit line are alternately disposed, and, in the example illustrated in FIG. 16, bit lines BL<1>, BL<3>, BL<5>, BL<7> are shielding bit lines. In addition, in the case of 8 KB reads and the SBL read mode, two selected bit lines and two shielding bit lines maybe alternately arranged, and, in the example illustrated in FIG. 16, bit lines BL<2>, BL<3>, BL<6>, and BL<7> are shielding bit lines.

In the case of 4 KB reads and the SBL read mode, one selected bit line and three shielding bit lines are alternately arranged, and, in the example illustrated in FIG. 16, bit lines BL<1> to BLL<3>, and BL<5> to BL<7> are shielding bit lines. In addition, in the case of 4 KB reads and the SBL read mode, two selected bit lines and six shielding bit lines may be alternately arranged, and, in the example illustrated in FIG. 16, bit lines BL<2> to BL<7> are shielding bit lines.

Furthermore, shielding bit lines may be set using a method other than those illustrated in FIG. 16.

1-3 Effect of First Embodiment

It is assumed that the ABL read mode is used in a case in which one page (for example, 16 KB) is read, and the SBL read mode is used, for example, in a case in which 8 KB data is read.

In addition, a time required for ABL read of the first level is denoted as CLK1_ABL, a time required for ABL read of the second level is denoted as CLK2_ABL, a time required for SBL read of the first level is denoted as CLK1_SBL, and a time required for SBL read of the second level is denoted as CLK2_SBL. With a shielding effect, the relation of "CLK2_SBL<CLK2_ABL" is generally satisfied. However, "CLK1_SBL<CLK1_ABL" may not be satisfied.

In such cases, in a case in which the SBL read mode is used for lower page read or upper page read of the 2-3-2 coding, the read time is not shortened. Accordingly, as a whole, the read time increases.

In contrast to this, according to the first embodiment, the sequencer 24 can execute an ABL first read operation of reading data from all the bit lines and an SBL read operation of applying a voltage used for shielding to a second group other than a first group among all the bit lines together with reading data from the first group among all the bit lines. Then, the sequencer 24 performs switching between the ABL read operation and the SBL read operation according to the number of read voltage levels that are necessary for determining data of a memory cell.

Thus, according to the first embodiment, the read time can be shortened. More specifically, the read time as a whole can be shortened to be less than that of a 16 KB read using only the ABL read or an 8 KB (or 4 KB) read using only the SBL read. As bit line capacitance increases, and the amount of electric charge charging the bit line increases, the read time can be further shortened.

In addition, by employing the configurations of the sense amplifier unit 28 and the data register 29 according to this embodiment, only a part of data among one page read in an ABL read operation can be output to the outside (the memory controller 3).

2 Second Embodiment

A second embodiment is another example of data assignment and is an example of 1-3-3 coding.

2-1 1-3-3 Coding

Figure 17:
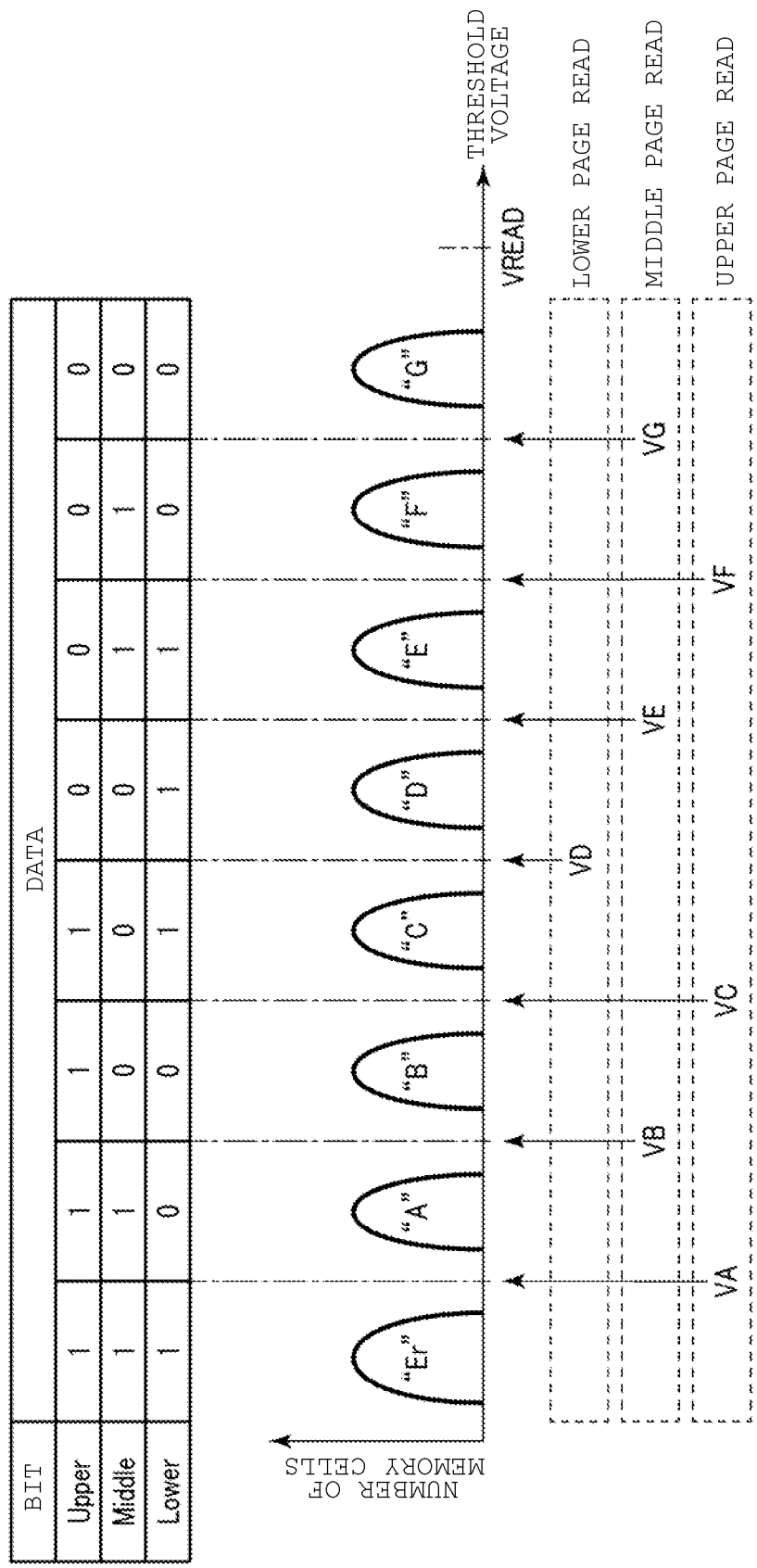
FIG. 17 is a schematic diagram illustrating one example of a threshold distribution of memory cell transistors according to a second embodiment.

FIG. 17 is a schematic diagram illustrating one example of a threshold distribution of memory cell transistors MT according to the second embodiment.

For example, data of "111", "011", "001", "101", "100", "110", "010", and "000" are respectively assigned to states of "Er", "A", "B", "C", "D", "E", "F", and "G".

In the 1-3-3 coding, in lower page read, by performing a read operation using one read voltage VD, it can be determined whether a lower bit stored in a memory cell transistor MT is data of "1" or data of "0". In addition, in middle page read, by performing a read operation using three read voltages VB, VE, and VG, it can be determined whether a middle bit stored in a memory cell transistor MT is data of "1" or data of "0". In upper page read, by performing a read operation using three read voltages VA, VC, and VF, it can be determined whether an upper bit stored in a memory cell transistor MT is data of "1" or data of "0".

In other words, read using a read voltage at one level is executed for a lower page, a read using read voltages at three levels is executed for a middle page, and read using read voltages at three levels is executed for an upper page, whereby 3-bit data stored in the memory cell transistor can be determined.

2-2 Read Operation

Figure 18:
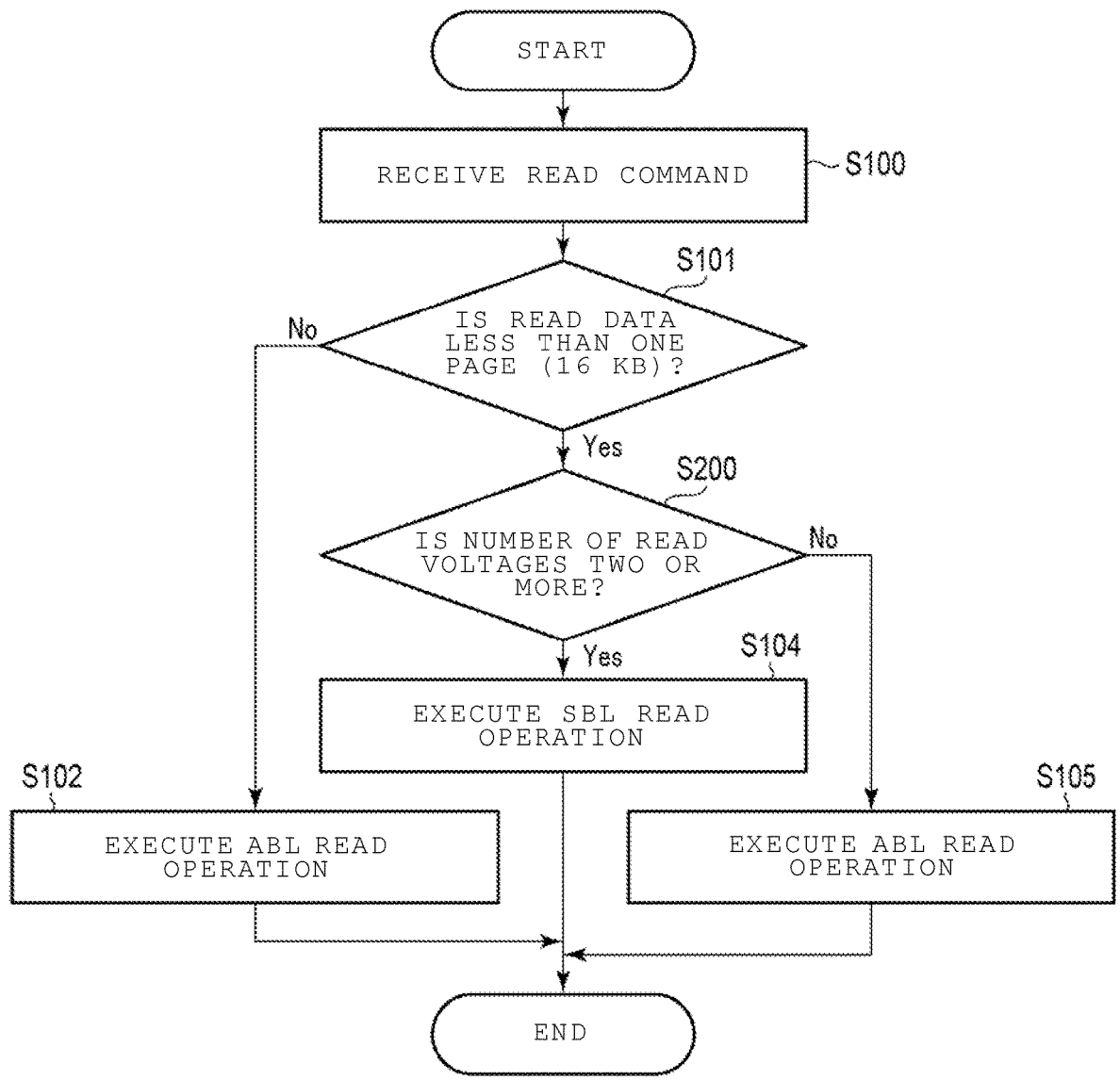
FIG. 18 is a flowchart of a read operation according to the second embodiment.

FIG. 18 is a flowchart of a read operation according to the second embodiment.

In the case of 8 KB read (Step S101=Yes), the sequencer 24 determines whether or not the number of required read voltages is two or more (Step S200). In Step S200, the determination is made using the type of coding and the type of page (a lower page, a middle page, or an upper page). The type of page is determined by the command.

In a case in which the number of read voltages is two or more (Step S200=Yes), in other words, in the case of middle page read or upper page read, the sequencer 24 executes an SBL read operation (Step S104).

On the other hand, in a case in which the number of read voltages is less than two (Step S200=No), in other words, in the case of lower page read, the sequencer 24 executes an ABL read operation (Step S105).

The case of 8 KB read, lower page read, middle page read, and upper page read will be described below.

Lower Page Read

Figure 19:
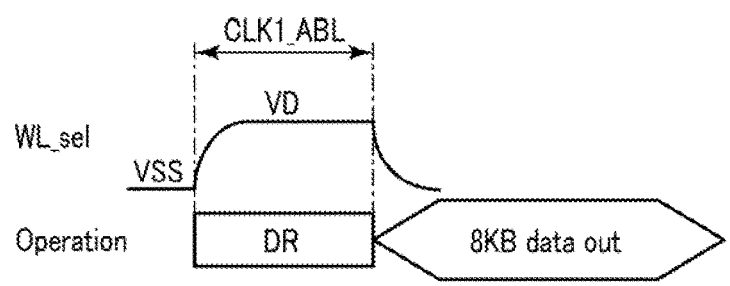
FIG. 19 is a timing diagram for a lower page read according to the second embodiment.

FIG. 19 is a timing diagram illustrating lower page read (LP read).

As described above, in lower page read, a read operation is executed using one read voltage VD. In the lower page read, the ABL read mode is executed. In a read operation DR, the row decoder applies the read voltage VD to a selected word line WL_sel. A time required for the read operation DR is denoted as CLK1_ABL.

In the lower page read, 16 KB data is read from the memory cell array. The sequencer 24 outputs 8 KB data designated by an address among the 16 KB data to the memory controller 3.

Middle Page Read

Figure 20:
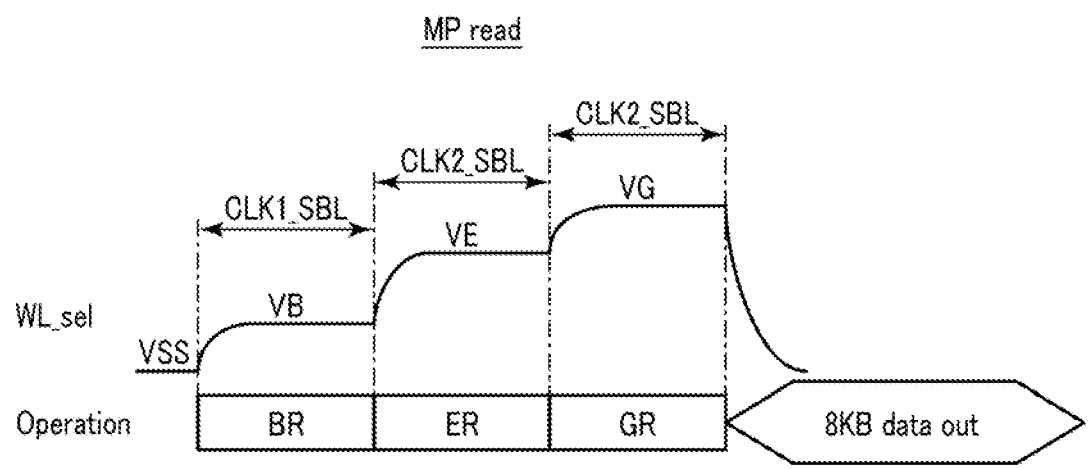
FIG. 20 is a timing diagram for a middle page read according to the second embodiment.

FIG. 20 is a timing diagram illustrating middle page read (MP read).

As described above, in the middle page read, a read operation is executed using three read voltages VB, VE, and VG. In the middle page read, an SBL read mode is executed. In read operations BR, ER, and GR, the row decoder respectively applies the read voltages VB, VE, and VG to the selected word line WL_sel. A time required for the read operation BR is denoted as CLK1_SBL, and a time required for the read operations ER and GR is denoted as CLK2_SBL. Thereafter, the sequencer 24 outputs the 8 KB data to the memory controller 3.

Upper Page Read

Figure 21:
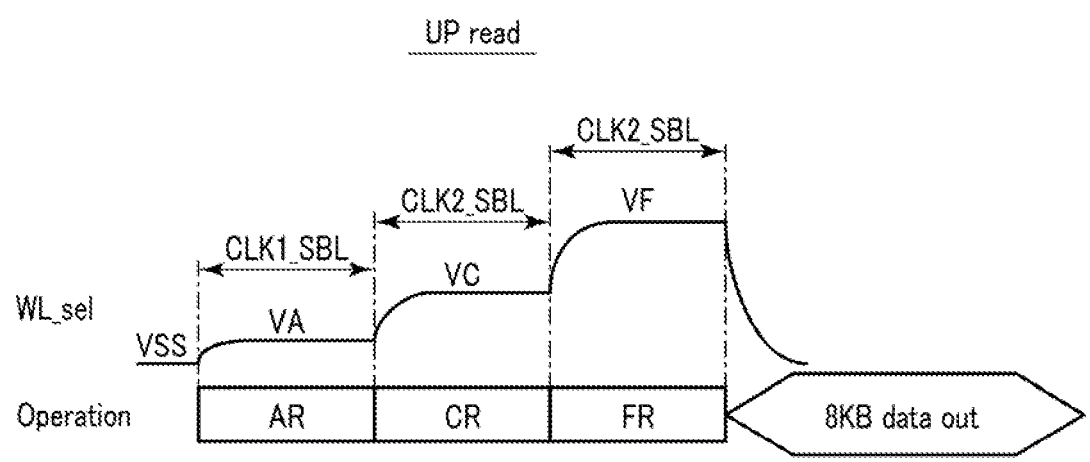
FIG. 21 is a timing diagram for an upper page read according to the second embodiment.

FIG. 21 is a timing diagram illustrating upper page read (UP read).

As described above, in the upper page read, a read operation is executed using three read voltages VA, VC, and VF. In the upper page read, the SBL read mode is executed. In read operations AR, CR, and FR, the row decoder respectively applies the read voltages VA, VC, and VF to the selected word line WL_sel. A time required for the read operation AR is denoted as CLK1_SBL, and a time required for the read operations CR and FR is denoted as CLK2_SBL. Thereafter, the sequencer 24 outputs the 8 KB data to the memory controller 3.

2-3 Effect of Second Embodiment

With the shielding effect, the relation of "CLK2_SBL<CLK2_ABL" is generally satisfied. On the other hand, as described above, the relation of "CLK1_SBL>CLK1_ABL" may be satisfied. In such cases, according to this embodiment, in the lower page read, the read time can be made shorter than that in the SBL read mode. In addition, in the middle page read and the upper page read, the read time can be made shorter than that in the ABL read mode. Accordingly, in 8 KB read, the read time can be shortened.

In addition, depending on the conditions, it may be considered that the ABL is advantageous up to one level, and the SBL is advantageous for two levels or more. For example, in a third embodiment, for the case of 1-2-4 coding, a case is illustrated as an example in which lower page read (using one voltage level) is performed using the ABL read mode, middle page read (using two voltage levels) is performed using the ABL read mode, and upper page read (using three voltage levels) is performed using the SBL read mode. However, in a case in which the ABL read mode is advantageous in terms of time up to one level, and the SBL read mode is advantageous in terms of time for two levels or more, it may be configured such that the lower page read (using one voltage level) is performed using the ABL read mode, the middle page read (using two voltage levels) is performed using the SBL read mode, and the upper page read (using three voltage levels) is performed using the SBL read mode.

3 Third Embodiment

A third embodiment is another example of data assignment and is an example of 1-2-4 coding.

3-1 1-2-4 Coding

Figure 22:
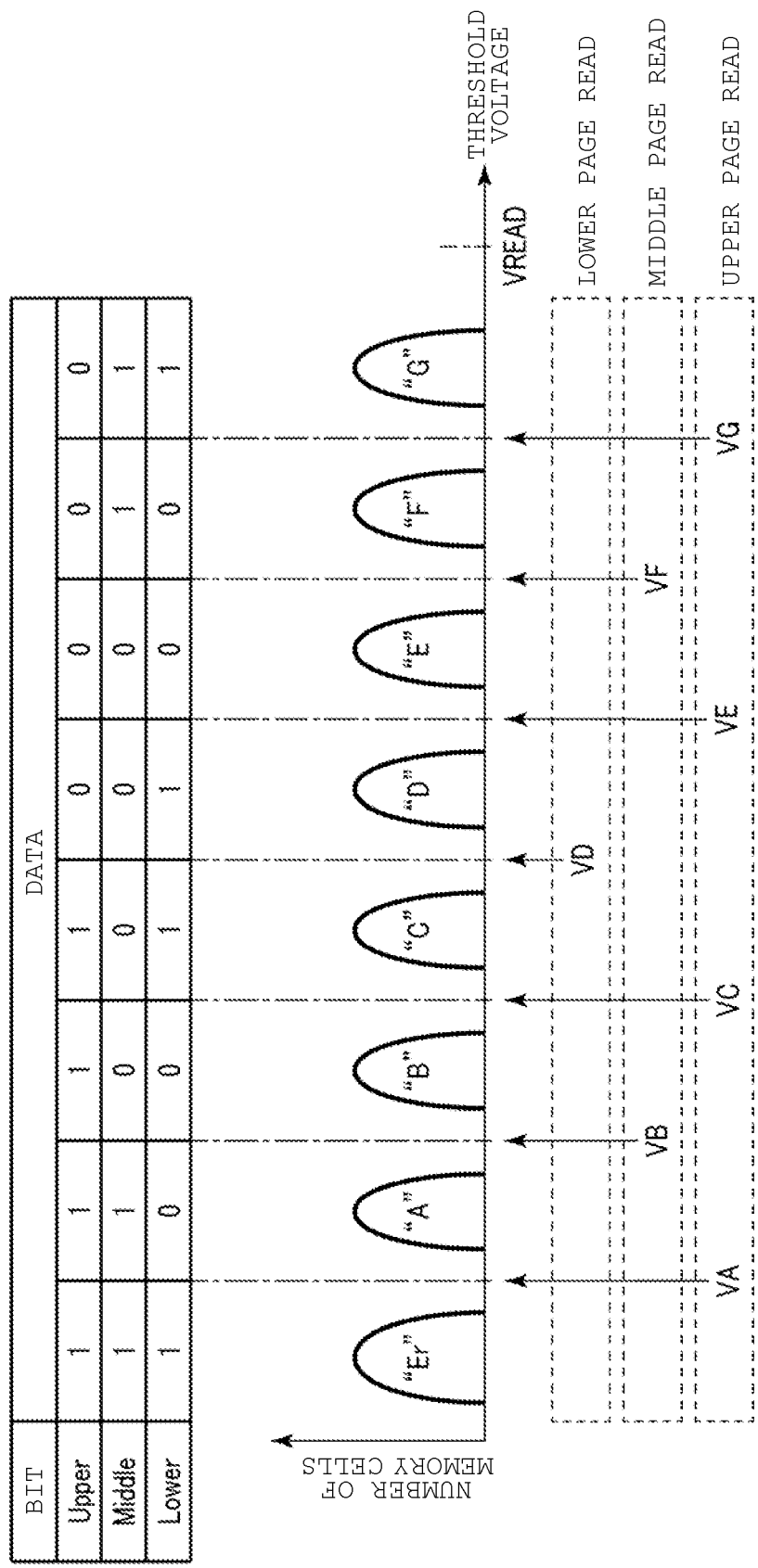
FIG. 22 is a schematic diagram illustrating one example of a threshold distribution of memory cell transistors according to a third embodiment.

FIG. 22 is a schematic diagram illustrating one example of a threshold distribution of memory cell transistors MT according to the third embodiment.

Data of "111", "011", "001", "101", "100", "000", "010", and "110" are respectively assigned to states of "Er", "A", "B", "C", "D", "E", "F", and G In the 1-2-4 coding, in lower page read, by performing a read operation using one read voltage VD, it can be determined whether a lower bit stored in a memory cell transistor MT is data of "1" or data of "0". In addition, in middle page read, by performing a read operation using two read voltages VB and VF, it can be determined whether a middle bit stored in a memory cell transistor MT is data of "1" or data of "0". In upper page read, by performing a read operation using four read voltages VA, VC, VE, and VF, it can be determined whether an upper bit stored in a memory cell transistor MT is data of "1" or data of "0".

In other words, a read using a read voltage of one level is executed once for a lower page, a read using read voltages of two levels is executed for a middle page, and a read using read voltages of four levels is executed for an upper page, whereby 3-bit data stored in the memory cell transistor is finally determined.

3-2 Read Operation

A flowchart for a read operation according to the third embodiment is the same as that in FIG. 12 described in conjunction with the first embodiment.

In a case in which the number of read voltages is three or more (Step S103=Yes), in other words, in the case of the upper page read, the sequencer 24 executes an SBL read operation (Step S104).

On the other hand, in a case in which the number of read voltages is less than three (Step S103=No), in other words, in the case of lower page read or middle page read, the sequencer 24 executes an ABL read operation (Step S105).

Hereinafter, in the case of 8 KB read, lower page read, middle page read, and upper page read will be sequentially described.

Lower Page Read

Figure 23:
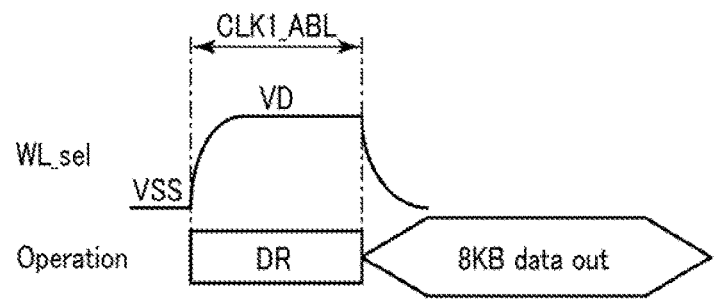
FIG. 23 is a timing diagram for a lower page read according to the third embodiment.

FIG. 23 is a timing diagram illustrating lower page read (LP read).

As described above, in lower page read, a read operation is executed using one read voltage VD. In the lower page read, the ABL read mode is executed. In a read operation DR, the row decoder applies the read voltage VD to a selected word line WL_sel. A time required for the read operation DR will be denoted as CLK1_ABL.

In the lower page read, 16 KB data is read from the memory cell array. The sequencer 24 outputs 8 KB data designated by an address among the 16 KB data to the memory controller 3.

Middle Page Read

Figure 24:
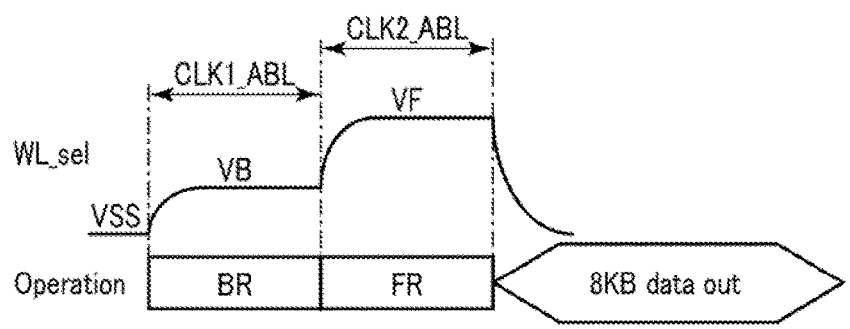
FIG. 24 is a timing diagram for a middle page read according to the third embodiment.

FIG. 24 is a timing diagram illustrating middle page read (MP read).

As described above, in the middle page read, a read operation is executed using two read voltages VB and VF. In the middle page read, an ABL read mode is executed. In read operations BR and FR, the row decoder respectively applies the read voltages VB and VF to the selected word line WL_sel. A time required for the read operation BR will be denoted as CLK1_ABL, and a time required for the read operation FR will be denoted as CLK2_ABL.

In the middle page read, 16 KB data is read from a memory cell array. The sequencer 24 outputs 8 KB data designated by an address among 16 KB data to the memory controller 3.

Upper Page Read

Figure 25:
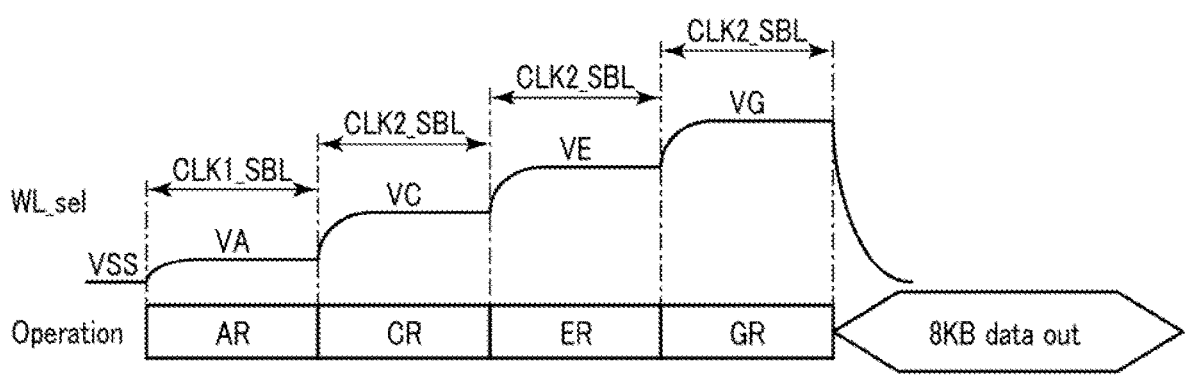
FIG. 25 is a timing diagram for an upper page read according to the third embodiment.

FIG. 25 is a timing diagram illustrating upper page read (UP read).

As described above, in the upper page read, a read operation is executed using four read voltages VA, VC, VE, and VG. In the upper page read, the SBL read mode is executed. In read operations AR, CR, ER, and GR, the row decoder respectively applies the read voltages VA, VC, VE, and VG to the selected word line WL_sel. A time required for the read operation AR will be denoted as CLK1_SBL, and a time required for the read operations CR, ER, and GR is denoted as CLK2_SBL. Thereafter, the sequencer 24 outputs the 8 KB data to the memory controller 3.

3-3 Effect of Third Embodiment

With the shielding effect, the relation of "CLK2_SBL<CLK2_ABL" is generally satisfied. On the other hand, as described above, the relation of "CLK1_SBL>CLK1_ABL" may be satisfied. In such cases, according to this embodiment, in the lower page read and the middle page read, the read time can be made shorter than that in the SBL read mode. In addition, in the upper page read, the read time can be made shorter than that in the ABL read mode. Accordingly, in 8 KB read, the read time can be shortened.

4 Modified Example

In the embodiments described above, although a case was described as an example in which one memory cell transistor stores 3-bit data, the data is not limited thereto. For example, one memory cell transistor may be able to store 2-bit data (multi-level cell (MLC)) or store 4-bit data or more. The embodiments described above may be applied also to such other examples.

In addition, as data having a small number of bits than one page, it is preferable that the number of bits is 1/(2×N) (where N is an integer of one or more) of the total number of bits in one page, and, for example, in a case in which one page is 16 KB, outputable data may be 8 KB (N=1), 4 KB (N=2), and so forth. However, the number of outputable bits is not limited thereto, and the number of outputable bits may be arbitrarily set.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array including memory strings, each memory string including a first select transistor and a second select transistor and a plurality of memory cells connected in series between the first and second select transistors;
a plurality of bit lines, each memory string having a bit line connected thereto;
a plurality of word lines, each word line being connected to a different one of the memory cells in the memory strings; and
a control circuit configured to execute a first read operation in which data is read at the same time from memory cells connected to all the bit lines in the plurality of bit lines and a second read operation in which data is read from memory cells connected to a first subset of bit lines in the plurality of bit lines and a shield voltage is applied to a second subset of bit lines in the plurality of bit lines, wherein the controller is further configured to select the first read operation or the second read operation according to the number of read voltage levels required for determining data stored in the memory cells.

2. The semiconductor memory device according to claim 1, wherein
the control circuit executes the first read operation when data having a first data length is to be output as read data in response to a read command, and
when data having a second length that is shorter than the first length is to be output as read data in response to the read command, the control circuit executes the first read operation if the data of the memory cells is determinable using a single read voltage level and executes the second read operation if the data of the memory cells is determinable using two or more read voltage levels.

3. The semiconductor memory device according to claim 2, further comprising:
a register for temporarily storing the data read from the memory cell array by execution of the first or second read operation, wherein
when data is output as read data after execution of the first read operation, the control circuit outputs only a part of the data stored in the register by execution of the first read operation.

4. The semiconductor memory device according to claim 2, wherein the second length is one half of the first length.

5. The semiconductor memory device according to claim 2, wherein the second length is equal to the first length multiplied by a value of 1/2×N, where N is a positive integer value.

6. The semiconductor memory device according to claim 1, wherein
the control circuit executes the first read operation when data having a first data length is to be output as read data in response to a read command, and
when data having a second length that is shorter than the first length is to be output as read data in response to the read command, the control circuit executes the first read operation if the data of the memory cells is determinable using two or less read voltage levels and executes the second read operation if the data of the memory cells is determinable using three or more read voltage levels.

7. The semiconductor memory device according to claim 6, further comprising:
a register for temporarily storing the data read from the memory cell array by execution of the first or second read operation, wherein
when data is output as read data after execution of the first read operation, the control circuit outputs only a part of the data stored in the register by execution of the first read operation.

8. The semiconductor memory device according to claim 6, wherein the second length is one half of the first length.

9. The semiconductor memory device according to claim 6, wherein the second length is equal to the first length multiplied by a value of 1/2×N, where N is a positive integer value.

10. The semiconductor memory device according to claim 6, wherein the shield voltage is lower than a voltage used for charging the plurality of bit lines when data is read from the memory cells.

11. The semiconductor memory device according to claim 1, wherein the shield voltage is lower than a voltage used for charging the plurality of bit lines when data is read from the memory cells.

12. A memory device, comprising:
a memory cell array comprising memory cells which are capable of storing multi-bit data; and
a controller to execute data reading writing operations on the memory cell array in response to commands from a host device, the controller being configured to:
receive a read command from the host;
calculate whether a size of data to be read from the memory cell array according to the read command is less than one page unit of the memory cell array;
determine, by reference to an address provided with the read command and a pre-established data coding scheme associated with the address, a number of read voltage levels required to read the data from the memory cell array according to the read command; and
execute one of a first read operation or a second read operation in response to the read command according to the size of the data to be read and the number of read voltage levels required to read the data from the memory cell array, wherein
in the first read operation, data is read from the memory cell array on all bits lines connected to an addressed page in the memory cell array at once, and
in the second read operation, data is read from the memory cell array on only a subset of bit lines connected to the addressed page at once with other bit lines connected to the addressed page being used as shielding bit lines.

13. The memory device according to claim 12, wherein the memory cells store three-bit data,
the pre-established coding is 2-3-2, and
the controller executes the second read operation in response to the read command when the address is for an upper page and the size of the data is less than one page unit and executes the first read operation in response to the read command otherwise.

14. The memory device according to claim 12, wherein the memory cells store three-bit data,
the pre-established coding is 1-3-3, and
the controller executes the second read operation in response to the read command when the address is for a middle page or an upper page and the size of the data is less than one page unit and executes the first read operation in response to the read command otherwise.

15. The memory device according to claim 12, wherein the memory cells store three-bit data,
the pre-established coding is 1-2-4, and
the controller executes the second read operation in response to the read command when the address is for an upper page and the size of the data is less than one page unit and executes the first read operation in response to the read command otherwise.

16. The memory device according to claim 12, wherein the controller executes the second read operation in response to read command when the address is for a page requiring two or more read voltage levels to determine the data stored in the memory cells and the size of the data is less than one page unit and executes the first read operation in response to the read command otherwise.

17. A control method of a memory device including a memory cell array, comprising:
receiving a read command from a host connected to the memory device;
calculating whether a size of data to be read from the memory cell array according to the read command is less than one page unit of the memory cell array;
determining, by reference to an address provided with the read command and a pre-established data coding scheme associated with the address, a number of read voltage levels required to read the data from the memory cell array according to the read command; and
executing one of a first read operation or a second read operation in response to the read command according to the size of the data to be read and the number of read voltage levels required to read the data from the memory cell array, wherein
in the first read operation, data is read from the memory cell array on all bits lines connected to an addressed page in the memory cell array at once, and
in the second read operation, data is read from the memory cell array on only a subset of bit lines connected to the addressed page at once with other bit lines connected to the addressed page being used as shielding bit lines.

18. The control method according to claim 17, wherein the second read operation is executed in response to the read command when the address is for a page requiring two or more read voltage levels to determine the data stored in the memory cells and the size of the data is less than one page unit, and
the first read operation is executed in response to the read command otherwise.

19. The control method according to claim 17, wherein the memory cell array comprises NAND flash-type memory cells.

* * * * *